United States Patent
Chien et al.

(10) Patent No.: US 7,915,664 B2
(45) Date of Patent: Mar. 29, 2011

(54) NON-VOLATILE MEMORY WITH SIDEWALL CHANNELS AND RAISED SOURCE/DRAIN REGIONS

(75) Inventors: Henry Chien, San Jose, CA (US); Takashi Orimoto, Sunnyvale, CA (US); George Matamis, San Jose, CA (US); James Kai, Santa Clara, CA (US); Vinod R. Purayath, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 238 days.

(21) Appl. No.: 12/105,242

(22) Filed: Apr. 17, 2008

(65) Prior Publication Data

US 2009/0261398 A1    Oct. 22, 2009

(51) Int. Cl.
*H01L 29/788*    (2006.01)
(52) U.S. Cl. . 257/316; 257/321; 257/326; 257/E29.129; 257/E29.3
(58) Field of Classification Search .......... 257/314–316, 257/321, 326, E29.129, E29.3
See application file for complete search history.

(56) References Cited

U.S. PATENT DOCUMENTS

| | | | |
|---|---|---|---|
| 4,931,847 A | 6/1990 | Corda | |
| 5,570,315 A | 10/1996 | Tanaka et al. | |
| 5,583,066 A | 12/1996 | Jung | |
| 5,774,397 A | 6/1998 | Endoh et al. | |
| 6,046,935 A | 4/2000 | Takeuchi et al. | |
| 6,125,060 A | 9/2000 | Chang | |
| 6,188,101 B1 | 2/2001 | Wang | |
| 6,222,762 B1 | 4/2001 | Guterman et al. | |
| 6,737,324 B2 | 5/2004 | Chang | |
| 6,746,918 B2 | 6/2004 | Wu | |
| 6,859,397 B2 | 2/2005 | Lutze et al. | |
| 6,888,755 B2 | 5/2005 | Harari et al. | |
| 6,917,542 B2 | 7/2005 | Chen et al. | |
| 7,023,736 B2 | 4/2006 | Cernea et al. | |
| 7,026,684 B2 | 4/2006 | Sakuma et al. | |
| 7,046,568 B2 | 5/2006 | Cernea | |
| 7,115,949 B2 | 10/2006 | Hoefler et al. | |
| 7,115,957 B2 | 10/2006 | Gonzalez et al. | |
| 7,120,051 B2 | 10/2006 | Gorobets et al. | |
| 7,154,779 B2 * | 12/2006 | Mokhlesi et al. | 365/185.01 |
| 7,196,928 B2 | 3/2007 | Chen | |

(Continued)

OTHER PUBLICATIONS

International Search Report and Written Opinion of the International Searching Authority, dated Aug. 13, 2009, PCT Patent Appl. No. PCT/US2009/039202.

*Primary Examiner* — Matthew E Warren
(74) *Attorney, Agent, or Firm* — Vierra Magen Marcus & DeNiro LLP

(57) ABSTRACT

A non-volatile storage system in which a sidewall insulating layer of a floating gate is significantly thinner than a thickness of a bottom insulating layer, and in which raised source/drain regions are provided. During programming or erasing, tunneling occurs predominantly via the sidewall insulating layer and the raised source/drain regions instead of via the bottom insulating layer. The floating gate may have a uniform width or an inverted T shape. The raised source/drain regions may be epitaxially grown from the substrate, and may include a doped region above an undoped region so that the channel length is effectively extended from beneath the floating gate and up into the undoped regions, so that short channel effects are reduced. The ratio of the thicknesses of the sidewall insulating layer to the bottom insulating layer may be about 0.3 to 0.67.

18 Claims, 16 Drawing Sheets

U.S. PATENT DOCUMENTS

| | | |
|---|---|---|
| 7,196,931 B2 | 3/2007 | Cernea et al. |
| 7,220,648 B2 | 5/2007 | Kim |
| 7,237,074 B2 | 6/2007 | Guterman et al. |
| 7,271,446 B2 | 9/2007 | Dokumaci et al. |
| 2004/0152260 A1 | 8/2004 | Rabkin et al. |
| 2005/0180186 A1 | 8/2005 | Lutze et al. |
| 2006/0071265 A1 | 4/2006 | Koh |
| 2006/0140007 A1 | 6/2006 | Cernea et al. |
| 2006/0158947 A1 | 7/2006 | Chan et al. |
| 2007/0032011 A1 | 2/2007 | Parekh et al. |
| 2007/0128786 A1 | 6/2007 | Cheng et al. |
| 2008/0006871 A1 | 1/2008 | Liao |

* cited by examiner

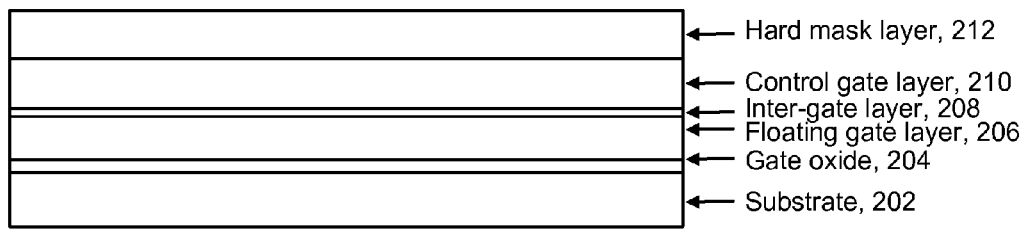
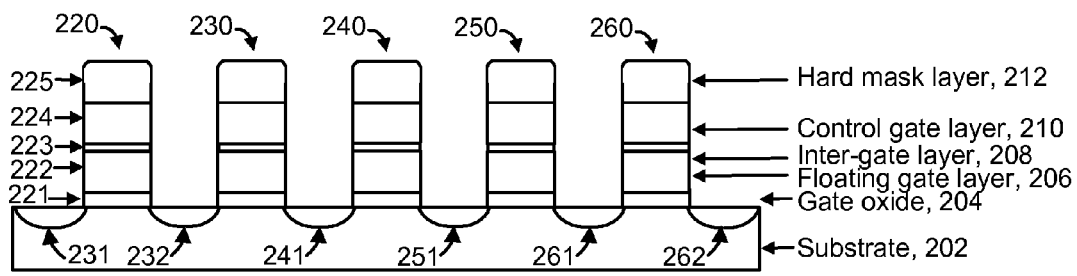
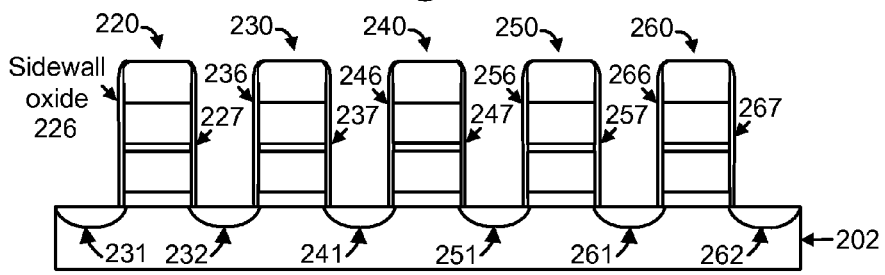
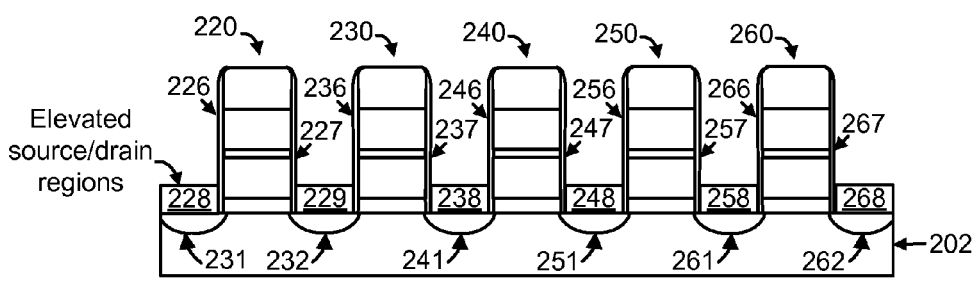

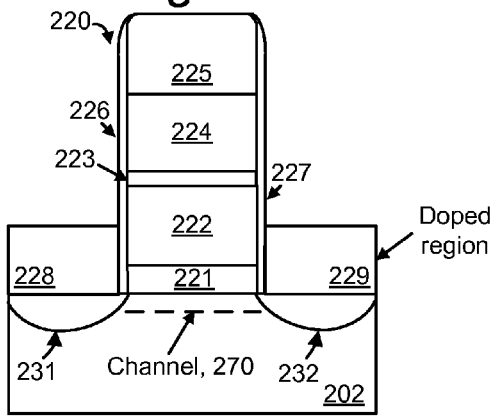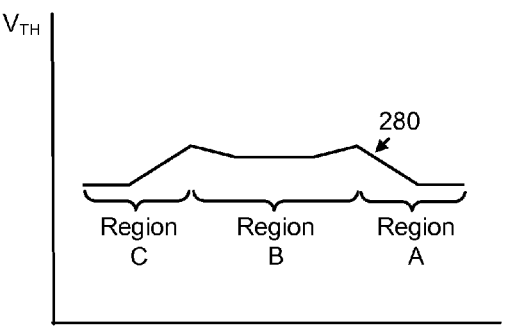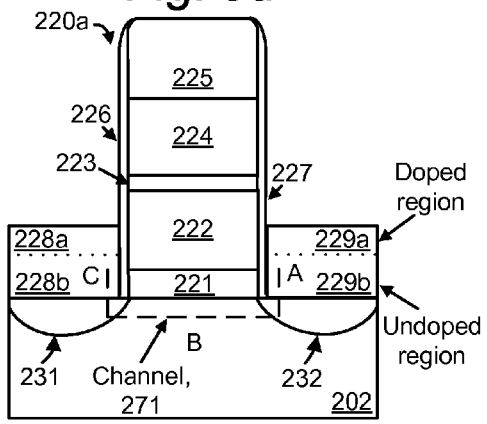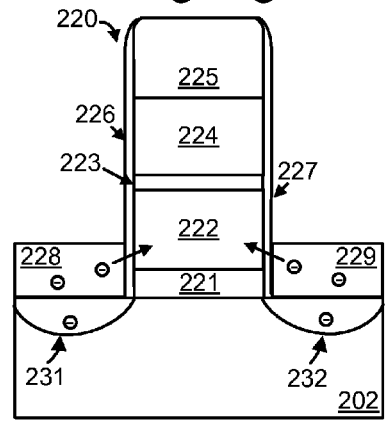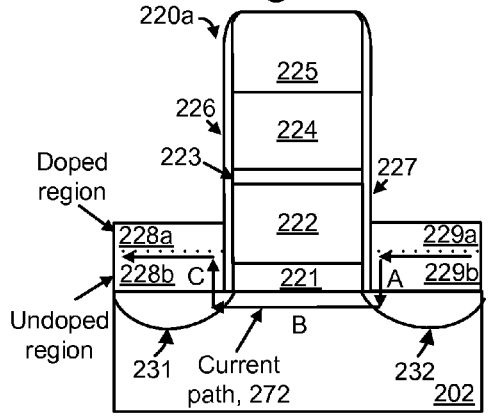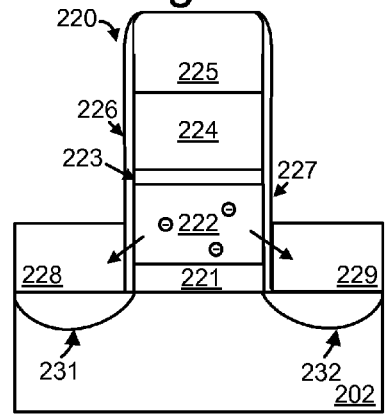

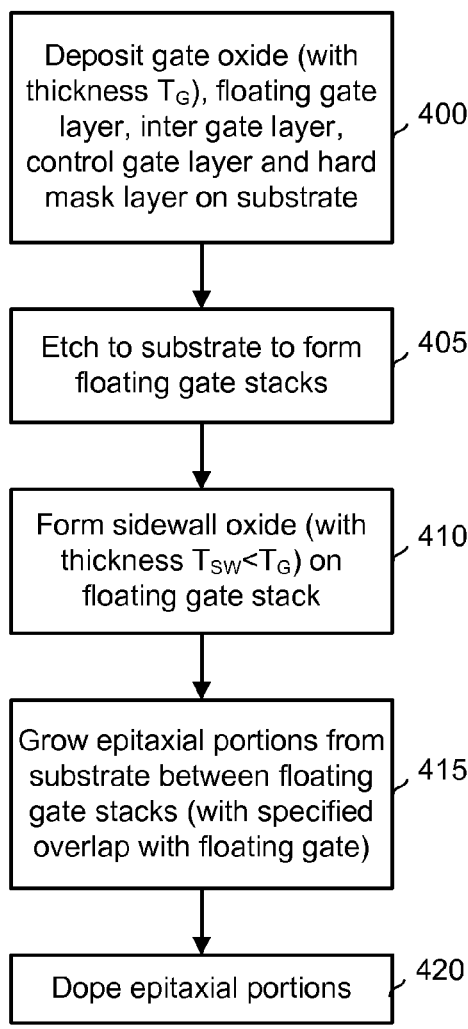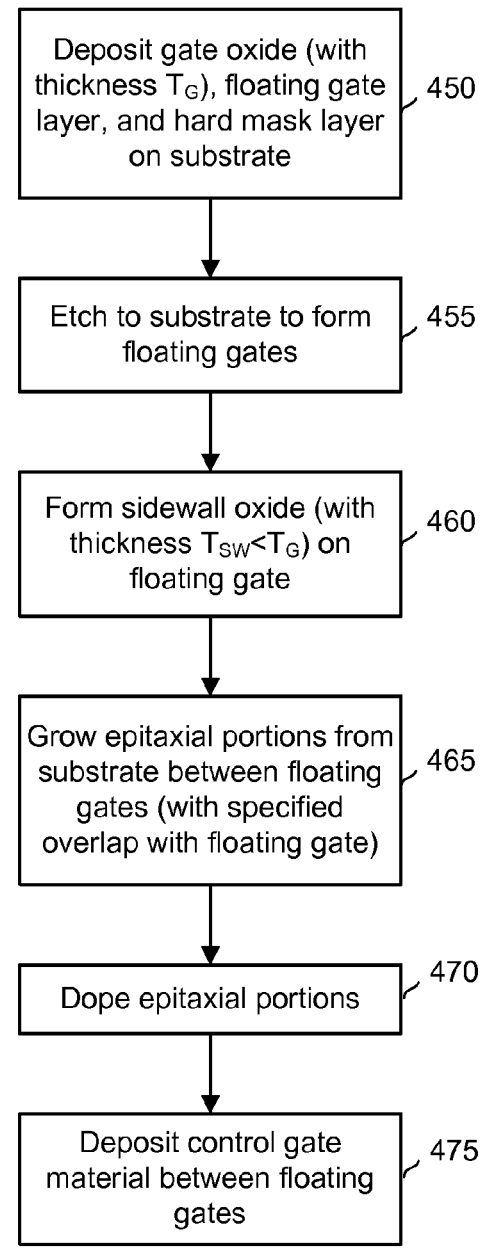

NON-VOLATILE MEMORY WITH SIDEWALL CHANNELS AND RAISED SOURCE/DRAIN REGIONS

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vt) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

However, various difficulties arise as device dimensions are scaled ever smaller. For example, the short channel effect causes a roll off in the threshold voltage of a storage element as the channel length becomes smaller. Charge trapping and de-trapping at the tunneling channel can also negatively impact data endurance, resulting in a drop in threshold voltage over time. Further, programming voltages may need to be reduced, negatively impacting programming times. Moreover, electromagnetic coupling between storage elements on adjacent word line can be problematic. Improvements are needed which address the above and other issues.

SUMMARY OF THE INVENTION

The present invention addresses the above and other issues by providing a non-volatile storage system in which non-volatile storage elements have a reduced sidewall oxide thickness relative to a gate oxide thickness to allow sidewall tunneling during programming.

In one embodiment, a non-volatile storage system includes non-volatile storage elements formed on a substrate and spaced apart from one another along the substrate in a first direction. Each non-volatile storage element includes an associated bottom insulating layer above the substrate, an associated floating gate above the bottom insulating layer, an associated control gate above the floating gate, and at least one associated sidewall insulating layer extending upwards at least partway along one side of the associated floating gate. Further, epitaxially grown regions extend upwards from the substrate between respective pairs of non-volatile storage elements to a height which is above a bottom level of the floating gates. For each non-volatile storage element, the at least one associated sidewall insulating layer has a thickness near the associated floating gate which is less than about two-thirds of a thickness of the bottom insulating layer.

In another embodiment, a non-volatile storage system includes non-volatile storage elements formed on a substrate. Each non-volatile storage element includes an associated bottom insulating layer above the substrate, an associated floating gate above the bottom insulating layer, an associated control, and at least one associated sidewall insulating layer extending upwards at least partway along one side of the associated floating gate. Source/drain regions extend upwards from the substrate between respective pairs of non-volatile storage elements to a height which is above a bottom level of the floating gates. For each non-volatile storage element, the at least one associated sidewall insulating layer has a thickness near the associated floating gate which is sufficiently less than a thickness of the bottom insulating layer so that, during programming of at least one of the non-volatile storage elements, electron tunneling from the associated source/drain region to the associated floating gate via the associated sidewall insulating layer substantially exceeds any electron tunneling to the associated floating gate from the substrate via the associated bottom insulating layer.

In another embodiment, at least one non-volatile storage element in a non-volatile storage system includes a bottom insulating layer above a substrate, a charge-storing portion above the bottom insulating layer, at least one conductive portion, coupled to a control line, and sidewall insulating layers extending upwards at least along part of the charge-storing portion on opposing sides of the charge-storing portion. Further, raised source-drain regions on either side of the charge-storing portion extend to a height which is above a bottom level of the charge-storing portion, where the sidewall insulating layers have a thickness near the charge-storing portion, on the opposing sides of the charge-storing portion, which is sufficiently less than a thickness of the bottom insulating layer so that, during programming of the at least one non-volatile storage element, when a program voltage is applied to the conductive portion of the at least one non-volatile storage element via the control line, electron tunneling to the charge-storing portion via the sidewall insulating layers substantially exceeds any electron tunneling to the charge-storing portion from the substrate via the bottom insulating layer.

Corresponding non-volatile storage systems, methods of operating the non-volatile storage systems, methods of fabricating the non-volatile storage systems and processor-readable code for instructing a processor to perform the methods of operating, may be provided.

BRIEF DESCRIPTION OF THE DRAWINGS

FIG. 1b is an equivalent circuit diagram of the NAND string of FIG. 1a.

FIG. 1c is a cross-sectional view of the NAND string of FIG. 1a.

FIG. 2a depicts a layered structure for use in forming non-volatile storage.

FIG. 2b depicts the layered structure of FIG. 2a after etching to form floating gate stacks and after providing source/drain regions between the floating gate stacks.

FIG. 2c depicts the structure of FIG. 2b after forming sidewall oxide layers on the floating gate stacks.

FIG. 2d depicts the structure of FIG. 2c after forming raised source/drain regions.

FIG. 3c depicts a channel region in an example non-volatile storage element having raised doped source/drain regions.

FIG. 3d depicts a channel region in an example non-volatile storage element having raised doped and undoped source/drain regions.

FIG. 3e depicts a current flow in the example non-volatile storage element of FIG. 3d during sensing.

FIG. 3f depicts a threshold voltage along the channel of FIG. 3d.

FIG. 3g depicts programming in an example non-volatile storage element having raised source/drain regions.

FIG. 3h depicts erasing in an example non-volatile storage element having raised source/drain regions.

FIG. 4a depicts a process for forming non-volatile storage with raised source/drain regions.

FIG. 4b depicts a process for forming non-volatile storage with raised source/drain regions and an inverted T floating gate structure.

DETAILED DESCRIPTION

The present invention provides a non-volatile storage system in which non-volatile storage elements have a reduced sidewall insulating layer thickness relative to a bottom insulating layer thickness to allow sidewall tunneling during programming.

Figure 1A:
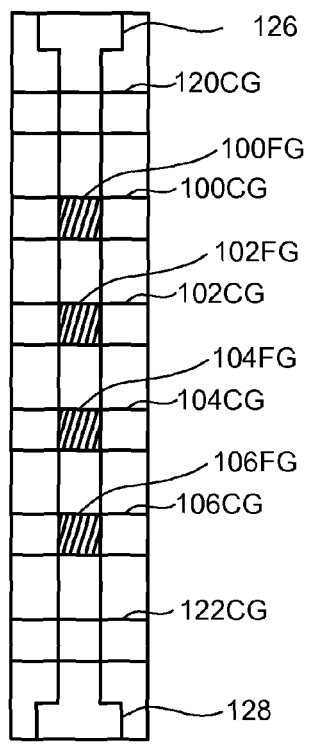
FIG. 1a is a top view of a NAND string.
Figure 1B:
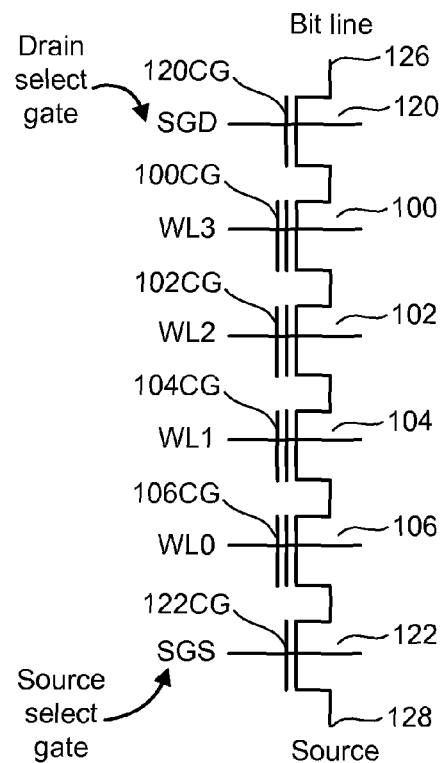

One example of a non-volatile memory system suitable for implementing the present invention uses the NAND flash memory structure, in which multiple transistors are arranged in series between two select gates in a NAND string. FIG. 1a is a top view showing one NAND string. FIG. 1b is an equivalent circuit thereof. The NAND string depicted in FIGS. 1a and 1b includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each storage elements. In other designs, the memory elements may include multiple transistors or may be different than those depicted in FIGS. 1a and 1b. Select gate 120 is connected to drain select line SGD, while select gate 122 is connected to source select line SGS.

Figure 1C:
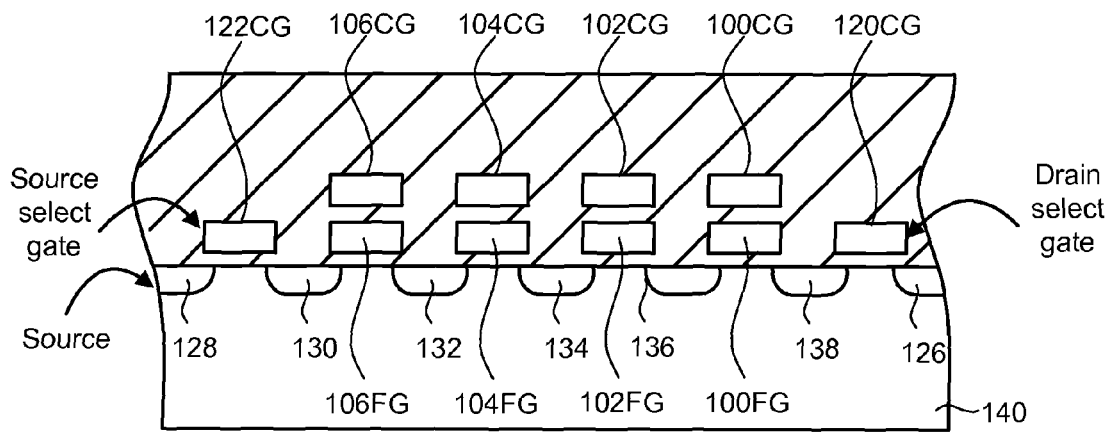

FIG. 1c provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a-c show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Generally, the invention can be used with devices that are programmed and erased by Fowler-Nordheim tunneling. The invention is also applicable to devices that use the nitride layer of a triple layer dielectric such as a dielectric formed of silicon oxide, silicon nitride and silicon oxide (ONO) to store charges instead of a floating gate. A triple layer dielectric formed of ONO is sandwiched between a conductive control gate and a surface of a semi-conductive substrate above the memory element channel. In some cases more than three dielectric layers may be used. Other layers, such as aluminum oxide, maybe used as well. An example of the latter is the Si-Oxide-SiN—$Al_2O_3$—TaN (TANOS) structure in which a triple layer of silicon oxide, silicon nitride and aluminum oxide is used. The invention can also be applied to devices that use, for example, small islands of conducting materials such as nano crystals as charge storage regions. Such memory devices can be programmed and erased in a similar way as floating gate based NAND flash devices.

FIG. 2a depicts a layered structure for use in forming non-volatile storage. As mentioned at the outset, as device dimensions are scaled ever smaller, various challenges arise relating, e.g., to the short channel effect, charge trapping and de-trapping at the tunneling channel, and electromagnetic coupling between storage elements. These problems can be addressed in one approach by providing a storage element structure in which the channel is effectively lengthened by forming elevated source/drain regions. The elevated source/drain regions can extend up to the floating gate so that an electron tunneling channel is created which is separate from the conduction control channel, e.g., in the substrate. As a result, charge trapping and de-trapping at the tunneling channel will have less impact on the conduction control channel, so that data endurance is improved. Data endurance generally refers to the ability of a storage element to maintain its threshold voltage over time. Moreover, the storage element channel length can be controlled independently via the vertical doping profile of the elevated source/drain regions instead of being limited by the horizontal pitch of the storage elements. Further, the elevated source/drain regions provide improved word line-to-word line electromagnetic shielding for adjacent floating gates during programming and/or reading. In one possible approach, the elevated source/drain regions are epitaxially grown from the substrate. However, other approaches are also possible, such as depositing a material over the source/drain regions in the substrate.

Further, various configurations may be used, including a configuration in which the storage elements including floating gate stacks, in which a control gate is over a floating gate and has a similar width as the floating gate, or a configuration in which the control gates are adjacent to the floating gates. A variation of the latter configuration uses a floating gate having an inverted T structure, as discussed further below.

Referring still to FIG. 2a, an embodiment which includes floating gate stacks is now discussed. The layered structure 200 includes a substrate 202, a gate oxide layer 204, a floating gate layer 206, an inter-gate layer 208, a control gate layer 210 and a hard mask layer 212. In an example implementation, the substrate may be a p-type silicon wafer having a p-well region which is formed in an n-well region. The gate oxide layer 204 may include a dielectric or insulating materials such as $SiO_2$. The floating gate layer 206 may include a material such as polysilicon which is doped so that it is electrically conductive. The inter-gate layer 208 may be a dielectric layer such as an O—N—O layer, which is a triple layer dielectric formed of silicon oxide, silicon nitride and silicon oxide. The control gate layer 210 may include a material similar to the floating gate, and may also be used to form the word lines. The hard mask layer 212 may be formed of a dielectric such as Silicon Nitride (SiN), although other suitable masking materials may also be used.

FIG. 2b depicts the layered structure of FIG. 2a after etching to form floating gate stacks and after providing source/drain regions between the floating gate stacks. The etching process may include first applying and patterning a photoresist layer over the hard mask layer 212. A patterned photoresist layer (not shown) may be formed by applying a blanket layer of photoresist and then patterning the photoresist using a lithographic process. In one approach, the photoresist is patterned by being exposed to UV light, although other patterning processes such as e-beam lithography may also be used. Photoresist slimming, which involves subjecting portions of the photoresist to etching to remove at least some photoresist and to make portions of the photoresist narrower, may hen be performed using a conventional etch such as a dry etch.

Subsequent to resist slimming, the slimmed portions of photoresist are used to pattern the underlying hard mask layer 212, and an etch is performed so that unexposed portions of the hard mask layer 212 is removed. The etch stops when the control gate layer 210 is reached, so that the hard mask layer 212 is patterned. The remaining portions of the photoresist are then removed. Subsequently, one or more etch steps are performed starting with the patterned hard mask layer 212, until the substrate 202 is reached. At this point, a number of spaced apart non-volatile storage elements 220, 230, 240, 250 and 260 are formed, in which the word lines form control gates that overlie floating gates in the respective storage elements. Select gates and drain gates (not shown) are similarly formed. Because the word lines and the floating gates are formed by the same etch step, they are self aligned. Source/drain regions between the storage elements can also be provided by implanting dopants into exposed areas of the substrate, between the floating gate stacks. These exposed areas lie between floating gates so that they connect storage elements of a NAND string in one approach. An example storage element 220 includes a gate oxide 221, a floating gate as a charge storing portion 222, an inter-gate dielectric 223, a control gate 224 and a hard mask portion 225. The cross-sectional view shown is in a direction along the NAND string. A word line direction extends into the page. In the substrate, example source/drain regions 231, 232, 241, 251, 261 and 262, which may be n+ type, may be provided using an appropriate implant process. An example n+ doping concentration is about $1.5 \times 10^{20}$ atoms/cm$^{-3}$.

FIG. 2c depicts the structure of FIG. 2b after forming sidewall oxide layers on the floating gate stacks. An insulating sidewall material 226, 227, 236, 237, 246, 247, 256, 257, 266 and 267 may be formed on opposing sides of the storage elements, or at least on one side of the storage elements. The sidewall material may be provided over the entire side of the floating gate stack, or over some portion of the side of the floating gate stack which includes all or part of the floating gate. Further, the sidewall material may include one or more layers. The sidewall insulating layers may be provided using different approaches, including oxidizing the sidewalls of the storage elements, depositing an oxide on the sidewalls of the storage elements, or a combination of these two approaches.

For sidewall oxidation, the device may be placed in a furnace at a high temperature (e.g., over 1000 Degrees Celsius) and with some fractional percentage of ambient oxygen gas, so that the exposed surfaces oxidize. Sidewall oxidation can also be used to round the edges of the floating gate and the control gate. An alternative to high temperature oxide growth is low temperature (e.g., 400 degrees Celsius) oxide growth in high density Krypton plasma.

FIG. 2d depicts the structure of FIG. 2c after forming raised source/drain regions. The raised source/drain regions 228, 229, 238, 248, 258 and 268 reach upwardly from the substrate 202 at least to a height which overlaps with the floating gates. In one approach, the raised source/drain regions are epitaxially grown from the substrate 202. However, this is not necessary as the raised source/drain regions can be provided, e.g., by depositing material on the substrate.

In one possible implementation, with the substrate exposed at the source/drain regions, a selective epitaxial process can be used to grow a layer of silicon on the exposed source/drain regions. In one embodiment, the epitaxial silicon layer is about 15 nm in height. Silicon can be grown epitaxially at temperatures of 500-650 C. The process is selective because the epitaxial silicon layer will grow on silicon, but will not grow on oxide or nitride. Therefore, the epitaxial regions are positioned between the floating gate stacks and in the active regions only. The epitaxial portions are self aligned because will only grow on the source/drain regions. Further, the epitaxial portions are electrically connected only to the source/drain regions.

Optionally, one or more layers of a spacer material such as nitride (not shown) can be provided on the sidewall oxide. Various other processing steps may be performed as will be apparent to those skilled in the art to obtain the final memory device, including filling in the array with a dielectric material, planarizing the surface, etching contacts, depositing metal to form interconnects and performing other backend processes.

Note that, in the above figures, a simplified example has been provided with only five storage elements in a NAND string. In practice, many more storage elements can be provided in a NAND string. Additionally, the fabrication process covers a wider area of the substrate so that many sets of NAND strings are formed on a common substrate. Further, not all details have been depicted, and the figures are not necessarily to scale. The following figures similarly do not necessarily depict all details.

Figure 3A:
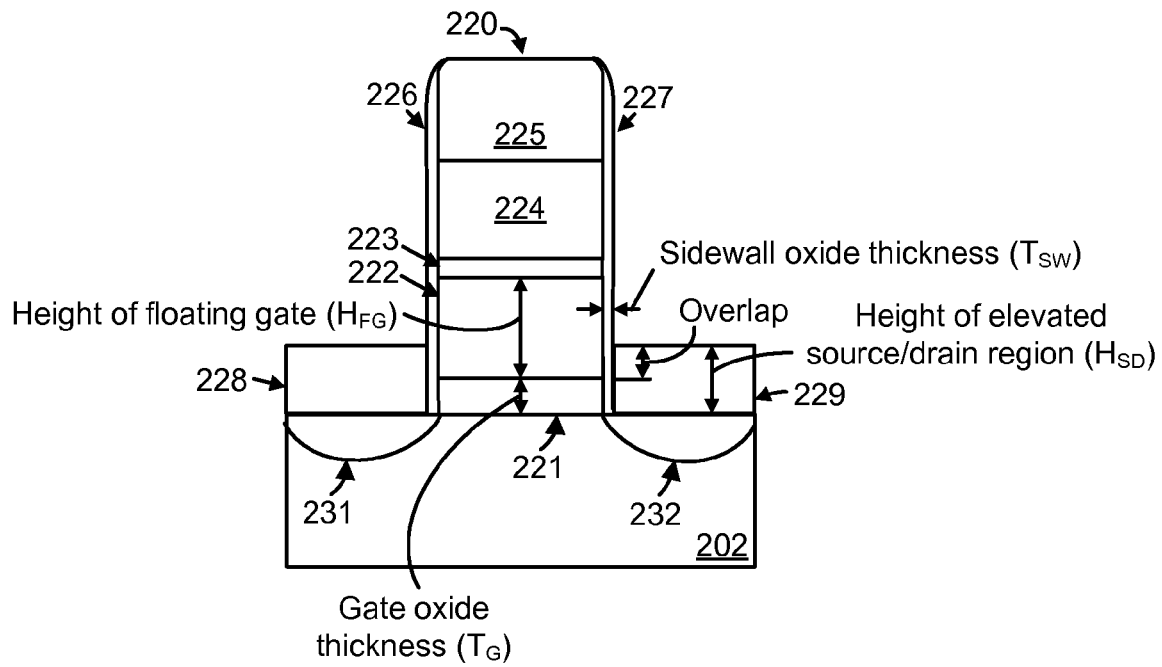
FIG. 3a depicts dimensions of an example non-volatile storage element having raised source/drain regions.

FIG. 3a depicts dimensions of an example non-volatile storage element having raised source/drain regions. The non-volatile storage element 220 of FIG. 2d is depicted as an example. Here, various dimensions of the non-volatile storage element can be seen, including a thickness ($T_G$) of the gate oxide 221, a height ($H_{FG}$) of the floating gate 222, a height ($H_{SD}$) of the elevated source/drain regions 228 and 229, and a thickness ($T_{SW}$) of the sidewall oxide 226, 227. An overlap of the source/drain regions 228, 229 relative to the floating gate is also depicted. The overlap indicates the extent to which the source/drain regions 228, 229 extend above a bottom level of the floating gate, and may be expressed, e.g., in terms of an absolute dimension, e.g., 5 nm, or as a percentage of the height of the floating gate, e.g., 20%. Note also that the non-volatile storage element 220 is depicted as having a generally symmetric configuration in which the source/drain regions 228 and 229 have the same height, each source/drain region has a relatively uniform height, the sidewall oxide material 226 and 227 have the same thickness and a uniform thickness, and so forth. However, it is possible for the non-volatile storage element 220 to be asymmetric in these and other dimensions. The elevated source/drain regions 228 and 229 may be doped n− type.

Figure 3B:
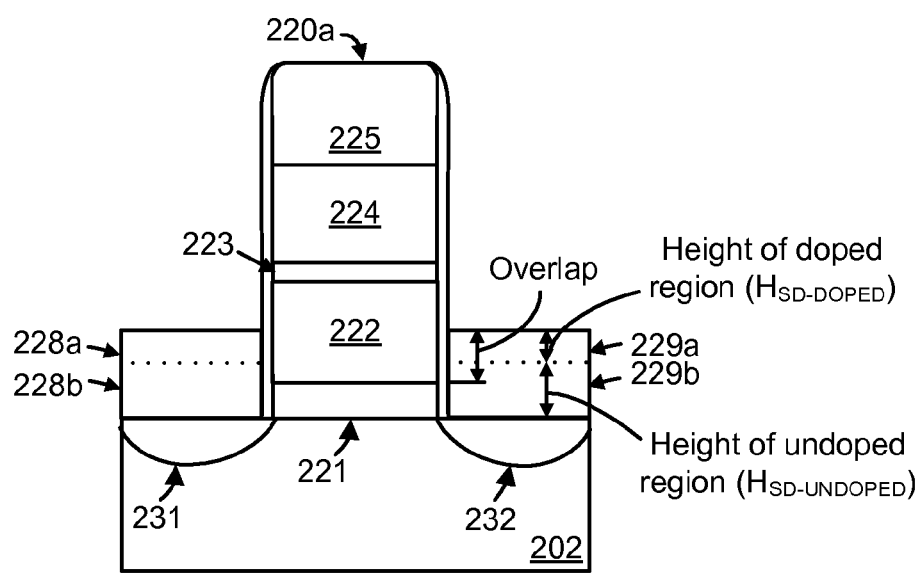
FIG. 3b depicts dimensions of an example non-volatile storage element having raised source/drain regions which include doped and undoped regions.

FIG. 3b depicts dimensions of an example non-volatile storage element having raised source/drain regions which include doped and undoped regions. The non-volatile storage element 220a is depicted as an example. Here, the source/drain regions each include a doped region and an undoped region. The undoped region may extend to a height which is above or below a bottom level of the floating gate. In particular, doped regions 228a and 229a are provided, each having a height $H_{SD-DOPED}$, and undoped regions 228b and 229b are provided, each having a height $H_{SD-UNDOPED}$. One advantage of this approach is that a sidewall channel dimension can be controlled, as the sidewall channel will extend in the undoped regions but not in the doped regions of the elevated source/drain regions, as discussed below. The dotted lines in FIG. 3b indicate a rough boundary between the doped and undoped regions. In practice, a gradual transition between the doped and undoped regions may be realized. Further, the doped regions may not be exactly uniform in depth.

FIG. 3c depicts a channel region in an example non-volatile storage element having raised doped source/drain regions. The non-volatile storage element 220 of FIG. 2d is depicted as an example. Here, a channel 270, represented by a dashed line, extends between the source/drain regions 231 and 232 in the substrate 202. As mentioned, this distance can be relatively small, resulting in problems such as the short channel effect. The channel length is equal to the length of the floating gate minus twice the length of the side diffusion of the source/drain junction, where the side diffusion is the portion of the source/drain regions which is under the floating gate.

FIG. 3d depicts a channel region in an example non-volatile storage element having raised doped and undoped source/drain regions. The non-volatile storage element 220a of FIG. 3b is depicted as an example. Here, the channel 271 includes three portions. Portions A and C extend along opposing sides of the non-volatile storage element, including in the undoped portions 228b and 229b of the elevated source/drain regions, while portion B extends in the substrate 202. The channel regions A and C may be considered to be dual sidewall channels. Advantageously, the effective length of the channel of the non-volatile storage element is increased, thereby alleviating the short channel effect. The channel length in this case is A+B+C, where B is the length of the floating gate plus twice the sidewall oxide thickness, and A and C are the heights of the undoped regions 229b and 228b, respectively.

FIG. 3e depicts a current flow in the example non-volatile storage element 220a of FIG. 3d during sensing. During sensing, such as reading or verifying, a determination is made as to whether a selected non-volatile storage element is in a conductive state. When the selected non-volatile storage element is in a conductive state, a current flows through each non-volatile storage element which is in series with the selected non-volatile storage element, in a NAND string, for instance. In particular, a current path 272 extends in the doped elevated source/drain region 229b, to the sidewall channel region A, to the substrate channel region B, to the sidewall channel region C, and to the doped elevated source/drain region 228b. The current path extends similarly in the other non-volatile storage elements which are in series with the example non-volatile storage element 220a.

FIG. 3f depicts a threshold voltage along the channel of FIG. 3d. The x-axis depicts distance along the channel, while the y-axis depicts threshold voltage ($V_{TH}$). During sensing, the curve 280 indicates that the threshold voltage will be highest in region B of the channel, e.g., the substrate region, so that sensing will occur via the gate oxide rather than via the sidewalls. For example, $V_{TH}$ may have a value of –3 V in the raised source/drain regions A and C, which is based on a potential of –5 V in the raised source/drain region A and C, plus 2 V due to sidewall charge trapping. Electrons are trapped or detrapped during electron tunneling and storage, respectively. $V_{TH}$ may have a value of about 0.7 V in the substrate region B. The peak $V_{TH}$ values between regions B and C, and between regions A and B, may be about 3 V. In contrast, as discussed below, during programming or erasing, electrons are transferred mainly via the sidewall oxides. Thus, the device has the advantage that the programming and erase mechanism can be controlled separately from the sensing mechanism.

FIG. 3g depicts programming in an example non-volatile storage element having raised source/drain regions. During programming, a relatively high program voltage, e.g., 12-20 V, is provided to the control gate 224 via an associated word line. The program voltage draws electrons into the floating gate 222 predominantly via the elevated source/drain regions 228 and 229 and the sidewall oxide material 226 and 227. That is, electron tunneling to the floating gate via the associated sidewall oxide or other sidewall insulating layer substantially exceeds any electron tunneling to the floating gate from the substrate via the gate oxide or other bottom insulating layer. For instance, the tunneling current via the associated sidewall oxide may be over one thousand times the tunneling current via the gate oxide. That is, the electron tunneling from the associated source/drain region to the associated floating gate via the associated sidewall insulating layer exceeds the electron tunneling to the associated floating gate from the substrate via the associated bottom insulating layer by at least 1000:1.

Example electrons are represented by circled dashes. Tunneling can occur via both sidewall insulating layers approximately equally, or via one sidewall insulating layer more than the other, or via one sidewall insulating layer only. The tunneling occurs via the portion of the elevated source/drain regions 228 and 229 which overlaps with the floating gate 222. Further, electrons may be drawn from the source/drain regions in the substrate to the elevated source/drain regions, and then to the floating gate. The effectiveness of the tunneling is expected to increase quickly and then plateau as a function of this overlap. For example, an overlap of no more than about 15-50% of a height of the floating gates should be sufficient to provide 100% effectiveness. Smaller overlaps may be sufficient as well, while larger overlaps are also acceptable. A smaller overlap avoids the need to extend the epitaxial region higher and may therefore be more efficient. Generally, the overlap should be less than 100% so that the raised source/drain regions do not extend above the top of the floating gate.

The reduced thickness of the sidewall regions relative to the gate oxide allows tunneling to occur predominantly via the sidewall regions. For example, the sidewall oxide or other sidewall insulating layer may have a thickness ($T_{SW}$) near the floating gate, on at least one side of each floating gate, which is less than about two-thirds, 0.6 or 0.4 of a thickness ($T_G$) of the gate oxide or other bottom insulating layer. $T_{SW}/T_G$ may be about 0.3 to 0.67, for instance. In an example configuration, the thickness of the sidewall insulating layers on at least one side of each floating gate is no more than about 6 nm, and the thickness of the bottom insulating layers is at least about 10 nm. In another example configuration, the thickness of the sidewall insulating layers on at least one side of each floating gate is no more than about 8 nm, and the thickness of the bottom insulating layers is at least about 12 nm. The height of the floating gate ($H_{FG}$) may be about 70-100 nm, and the width of the floating gate may be about 9 nm. A spacing between the sidewall layers of adjacent floating gates may be about 9 nm as well. Further, the floating gates may be spaced apart from one another along the substrate in the NAND string direction by a pitch of no more than about 30 nm, or a half pitch of no more than about 15 nm.

An additional benefit of the raised source/drain regions 228 and 229 is that they shield the floating gates from electromagnetic coupling from adjacent floating gates, e.g., during programming or read operations, so that disturb mechanisms are reduced. Further, raised source/drain regions with a greater height can provide improved shielding. The shielding lessens the electromagnetic coupling.

FIG. 3h depicts erasing in an example non-volatile storage element having raised source/drain regions. During erasing, a relatively high erase voltage, e.g., 20 V, is provided to the substrate 202, causing a reverse effect to that described in FIG. 3g. In particular, electrons tunnel out of the floating gate 222 and into the elevated source/drain regions 228 and 229 via the sidewall oxide layers. Further, electrons may be drawn from the elevated source/drain regions 228 and 229 to the source/drain regions 231 and 232, respectively, in the substrate. As before, the tunneling mechanism occurs predominantly via the sidewall oxide layers since they are substantially thinner than the gate oxide. Electron tunneling from the floating gate via the associated sidewall oxide or other sidewall insulating layer substantially exceeds any electron tunneling from the floating gate to the substrate via the gate oxide or other bottom insulating layer. Further, the tunneling can occur via one or both sidewall layers. Example electrons are represented by circled dashes.

Figure 3I:
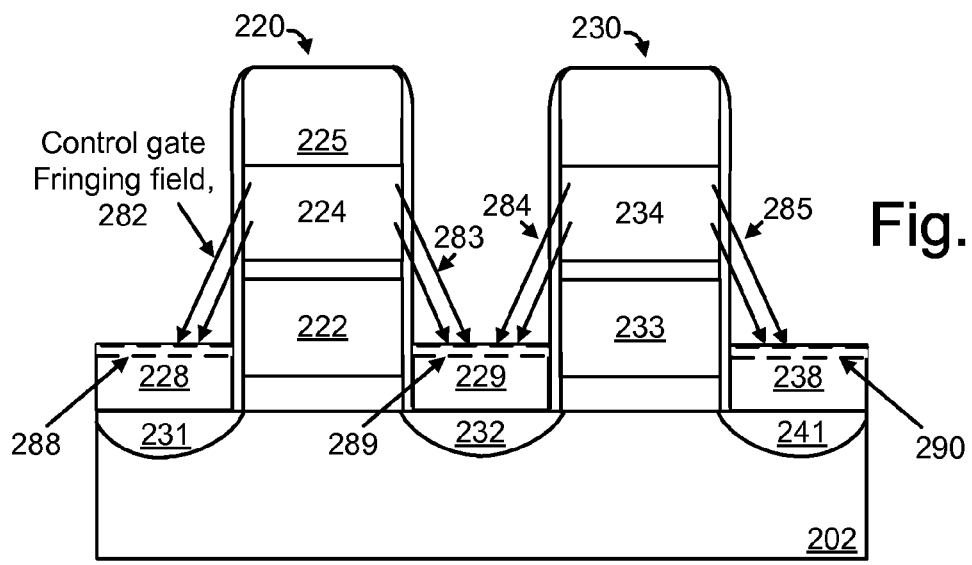
FIG. 3i depicts a control gate fringing field in an example non-volatile storage element.

FIG. 3i depicts a control gate fringing field in an example non-volatile storage element. The use of raised source/drain regions results in a shorter distance between the control gates and the source/drain regions compared to designs in which the source/drain regions are not raised above the substrate. As a result, a relatively strong fringing field can be realized in the raised source/drain regions when a relatively high voltage is applied to the one or more control gates of the storage elements. The fringing field is an electric field which extends between a control gate and a raised source/drain region.

Here, example storage elements 220 and 230 are depicted with associated raised source/drain regions 228, 229 and 238, and associated substrate source/drain regions 231, 232 and 241. Note that source/drain regions 232 and 229 are shared by the adjacent storage elements 220 and 230. Moreover, fringing fields represented by arrows 282 and 283 extend between the control gate 224 and the elevated source/drain regions 228 and 229, respectively. Similarly, fringing fields represented by arrows 284 and 285 extend between the control gate 234 and the elevated source/drain regions 229 and 238, respectively. Due to the fringing fields, conduction layers 288, 289 and 290 are induced in the raised source/drain regions 228, 229 and 238, respectively. The fringing fields can thus turn on the gap region between storage elements, thereby providing a conduction path between the storage elements without a heavily doped source/drain junction. No n− implant is used in this case in the epitaxial region.

Figure 3J:
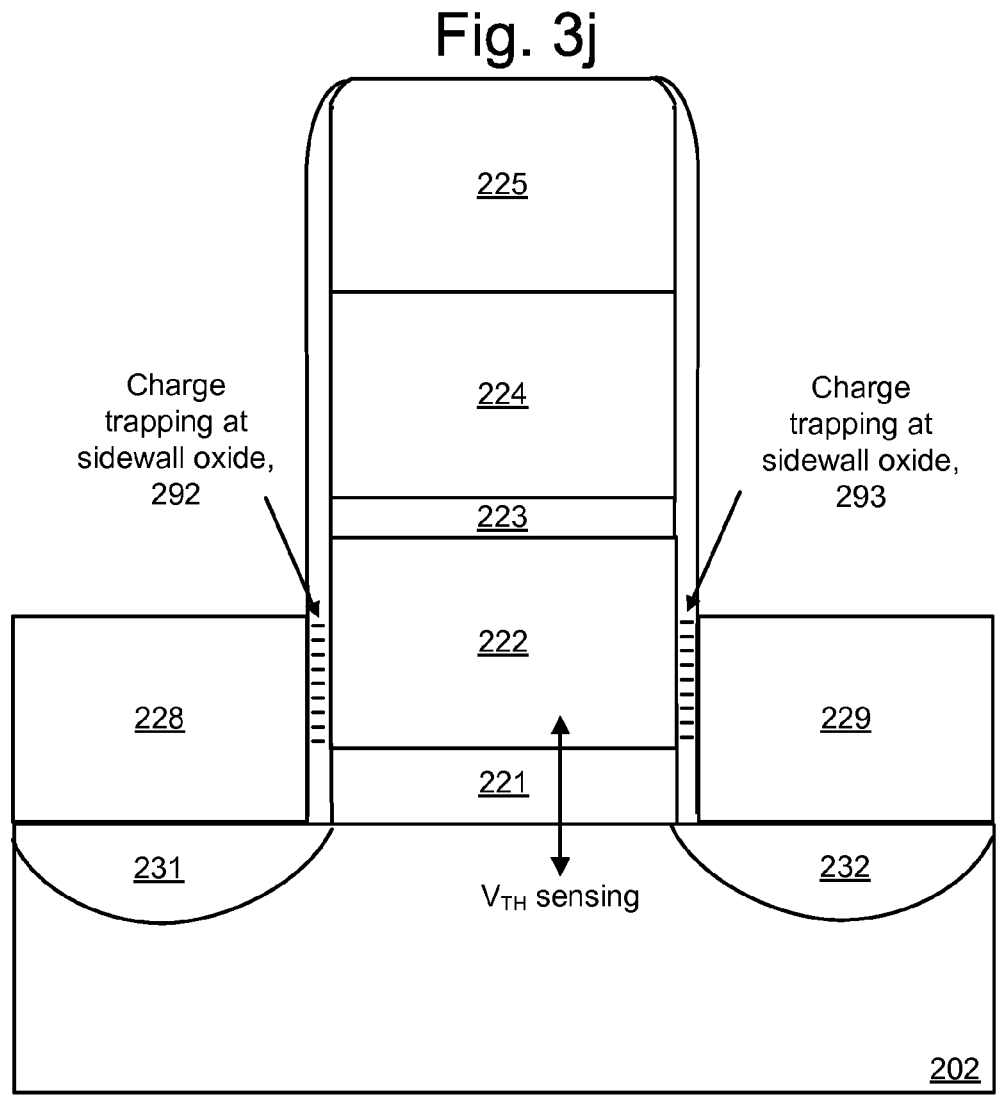
FIG. 3j depicts charge trapping at the sidewall oxide in an example non-volatile storage element.

FIG. 3j depicts charge trapping at the sidewall oxide in an example non-volatile storage element. Charge trapping at the sidewall oxide is represented by electrons (dashes) 292 and 293. As mentioned, tunneling during program and erase occurs predominantly via the sidewall oxide. During tunneling, some charges are trapped in the sidewall oxide. Subsequently, when charge is stored in the floating gate 222, some of the trapped charges can de-trap, e.g., spontaneously leave the sidewall oxide and enter the source/drain regions. Advantageously, this charge trapping does not result in a shift in threshold voltage since sensing of the threshold voltage occurs via the gate oxide, as discussed, e.g., in connection with FIG. 3f, essentially bypassing any effects due to charge trapping and de-trapping in the sidewall oxides. That is, there is little or no charge trapping and de-trapping in the gate oxide. In contrast, in conventional devices, charge trapping and de-trapping occurs predominantly at the gate oxide. Charge trapping can raise the threshold voltage, e.g., by about 2 V, while charge de-trapping can lower the threshold voltage, e.g., by about 1 V, resulting in reduced data retention and storage element endurance.

Figure 3K:
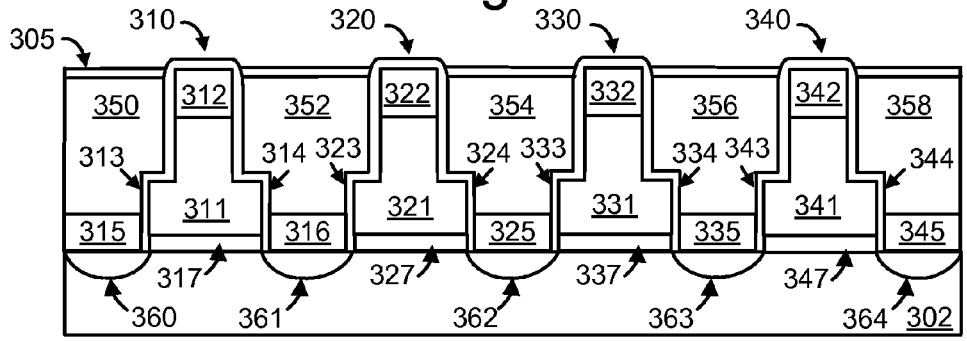
FIG. 3k depicts an example set of non-volatile storage elements having raised doped source/drain regions and an inverted-T floating gate structure

FIG. 3k depicts an example set of non-volatile storage elements having raised doped source/drain regions and an inverted-T floating gate structure. In some of the above examples, the storage elements were configured as floating gate stacks, in which the floating gates and control gates had similar widths, along a length of the NAND string, and the control gates were stacked above the floating gates. In this embodiment, the raised source/drain regions are used with an inverted T shaped floating gate. An inverted T shaped floating gate is discussed, e.g., in U.S. Pat. No. 7,026,684, titled "Non-volatile Semiconductor Memory Device," issued Apr. 11, 2006, and incorporated herein by reference. In this approach, the floating gate has a bottom portion which is wider than its top portion, along a length of the NAND string. The top and bottom portions of the floating gate can be the same material or different materials. Further, the control gates are provided between the floating gates rather than above the floating gates, so that two control gates can be used to program a single floating gate, in one possible approach.

The inverted T extends in the word line direction to create a floating gate which is wider at the bottom than the top. The narrower top floating gate portion creates a wider spacing between the word lines to allow a thick insulating layer which allows higher word line voltages to achieve faster programming speed, while the wider lower floating gate portion provides the storage element with a longer channel which further reduces short channel effects.

For example, a substrate 302 is provided in which source/drain regions 360, 361, 362, 363 and 364 are provided. Example storage elements 310, 320, 330 and 340 are provided. Storage element 310 includes a gate oxide 317, floating gate 311, a hard mask region 312 (such as an insulating film), and sidewall oxide or other insulation layer 313 and 314. Storage element 320 includes a gate oxide 327, floating gate 321, hard mask region 322, and sidewall oxide or other insulation 323 and 324. Storage element 330 includes a gate oxide 337, floating gate 331, hard mask region 332, and sidewall oxide or other insulation 333 and 334. Storage element 340 includes a gate oxide 347, floating gate 341, hard mask region 342, and sidewall oxide or other insulation 343 and 344. Control gate regions 350, 352, 354, 356 and 358 are also provided. A top metal salicide layer 305 is also provided.

As before, the floating gates and control gates may include polysilicon, for example, doped with impurities which lower the resistance.

Figure 3L:
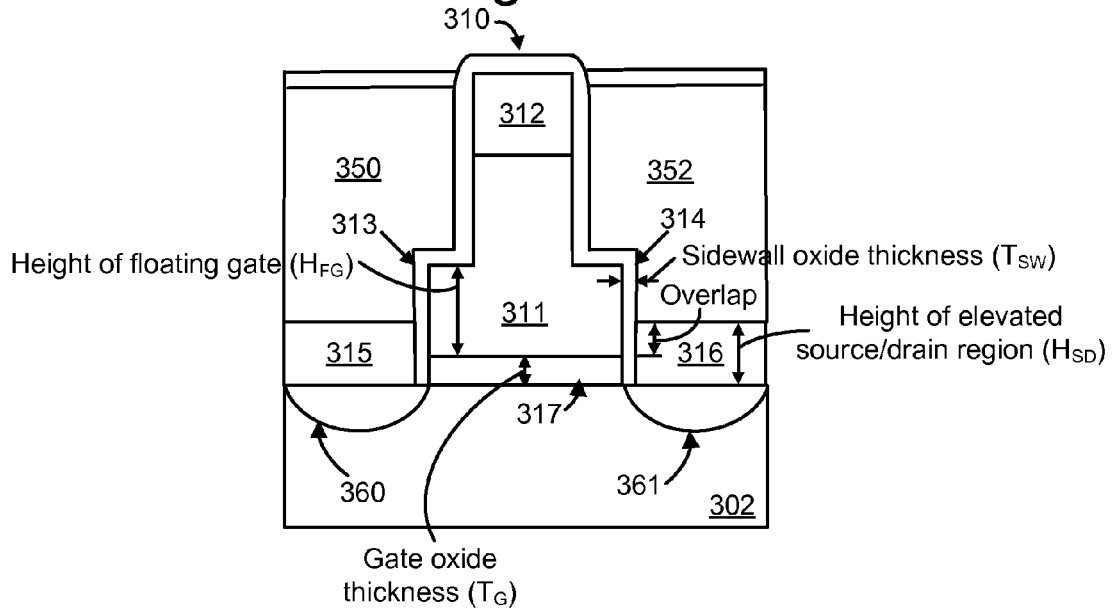
FIG. 3l depicts dimensions of an example non-volatile storage element having raised source/drain regions and an inverted-T floating gate structure.

FIG. 3l depicts dimensions of an example non-volatile storage element having raised source/drain regions and an inverted-T floating gate structure. The non-volatile storage element 310 is depicted.

Here, various dimensions of the non-volatile storage element can be seen, including a thickness ($T_G$) of the gate oxide 317, a height ($H_{FG}$) of a bottom portion (e.g., the wider portion which is the top of the inverted T) of the floating gate 311, a height ($H_{SD}$) of the elevated source/drain regions 315 and 316, and a thickness ($T_{SW}$) of the sidewall oxide 313, 314. An overlap of the source/drain regions 313, 314 relative to the floating gate 311 is also depicted. The overlap indicates the extent to which the source/drain regions 313, 314 extend above a bottom level of the floating gate, and may be expressed, e.g., in terms of an absolute dimension or as a percentage of the height of the bottom portion of the floating gate, or as a percentage of the total height of the floating gate (which includes top and bottom portions). Note also that the non-volatile storage element 310 is depicted as having a generally symmetric configuration, but can be asymmetric, as discussed previously. The elevated source/drain regions 315 and 316 may be doped throughout, or include a doped region over an undoped region, as discussed previously, e.g., in connection with FIG. 3b.

Figure 3M:
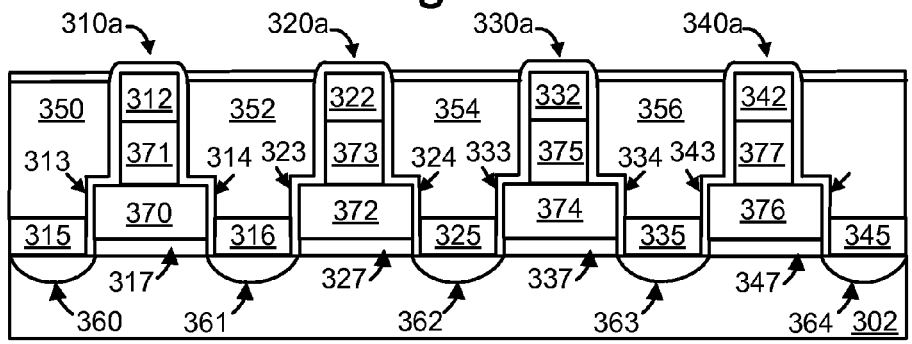
FIG. 3m depicts an example non-volatile storage element having raised doped source/drain regions and an inverted-T two-part floating gate structure.

FIG. 3m depicts an example non-volatile storage element having raised doped source/drain regions and an inverted-T two-part floating gate structure. Here, the storage elements 310a, 320a, 330a and 340a correspond to the storage elements 310, 320, 330 and 340, respectively, of FIG. 3k, except that the floating gates include two portions, e.g., a narrower top potion and a wider bottom portion. For example, storage element 310a includes a floating gate having a top portion 371 and a bottom portion 370, storage element 320a includes a floating gate having a top portion 373 and a bottom portion 372, storage element 330a includes a floating gate having a top portion 375 and a bottom portion 374 and storage element 340a includes a floating gate having a top portion 377 and a bottom portion 376. The top and bottom portions may be deposited in corresponding steps, and may include the same or different materials.

Note that other storage element configurations are possible as well. For example, the control gate may be stacked above the floating gate, similar to FIG. 3a, but in a stack whose width decreases with height, e.g., in a trapezoidal or pyramidal manner. Thus, the width of the control gate is less than a width of the floating gate. Or, the configuration of FIG. 3l may be modified by providing a constant width for the floating gate throughout its height. Or, the configuration of FIG. 3*l* may be modified by providing a gradually changing width for the floating gate throughout its height, e.g., in a trapezoidal or pyramidal manner. Various other configurations are possible as well.

FIG. 4*a* depicts a process for forming non-volatile storage with raised source/drain regions. Step 400 includes forming the layered structure of FIG. 2*a*, for instance, by depositing a gate oxide having a thickness $T_G$, a floating gate layer, an inter-gate layer, a control gate layer and a hard mask layer on a substrate. Step 405 includes etching to the substrate to form floating gate stacks, e.g., as depicted in FIG. 2*b*. One or more etching and masking steps may be used as appropriate. Step 410 includes forming a sidewall oxide or other sidewall insulating layer. The thickness $T_{SW}$ of the layer is less than a thickness $T_G$ of the gate oxide. Step 415 includes growing epitaxial portions from the substrate between the floating gate stacks, with a specified overlap with the floating gate. The epitaxial portions provide the raised source/drain regions, in one possible approach. In another approach, the raised source/drain regions are provided by depositing a material such as silicon on the substrate rather than using a epitaxial process. Step 420 includes doping the epitaxial portions. As discussed, the doping can extend to all or only a portion of the depth of the raised source/drain regions.

FIG. 4*b* depicts a process for forming non-volatile storage with raised source/drain regions and an inverted T floating gate structure. Step 450 includes depositing a gate oxide having a thickness $T_G$, a floating gate layer, and a hard mask layer on a substrate. Step 455 includes etching to the substrate to form the inverted T floating gate stacks, e.g., as depicted in FIG. 3*l*. One or more etching and masking steps may be used as appropriate. Step 460 includes forming a sidewall oxide or other sidewall insulating layer on the floating gate. The thickness $T_{SW}$ of the layer is less than a thickness $T_G$ of the gate oxide. Step 465 includes growing epitaxial portions from the substrate between the floating gates, with a specified overlap with the floating gate. The epitaxial portions provide the raised source/drain regions, in one possible approach. In another approach, the raised source/drain regions are provided by depositing a material on the substrate. Step 470 includes doping the epitaxial portions. As discussed, the doping can extend to all or only a portion of the depth of the raised source/drain regions. Step 475 includes depositing the control gate material between the floating gates.

The steps mentioned above are of a general nature and do not include all details. For example, various other processing steps may be performed as will be apparent to those skilled in the art to obtain the final memory device, including filling in the array with a dielectric material, planarizing the surface, etching contacts, depositing metal to form interconnects and performing other backend processes.

Figure 5:
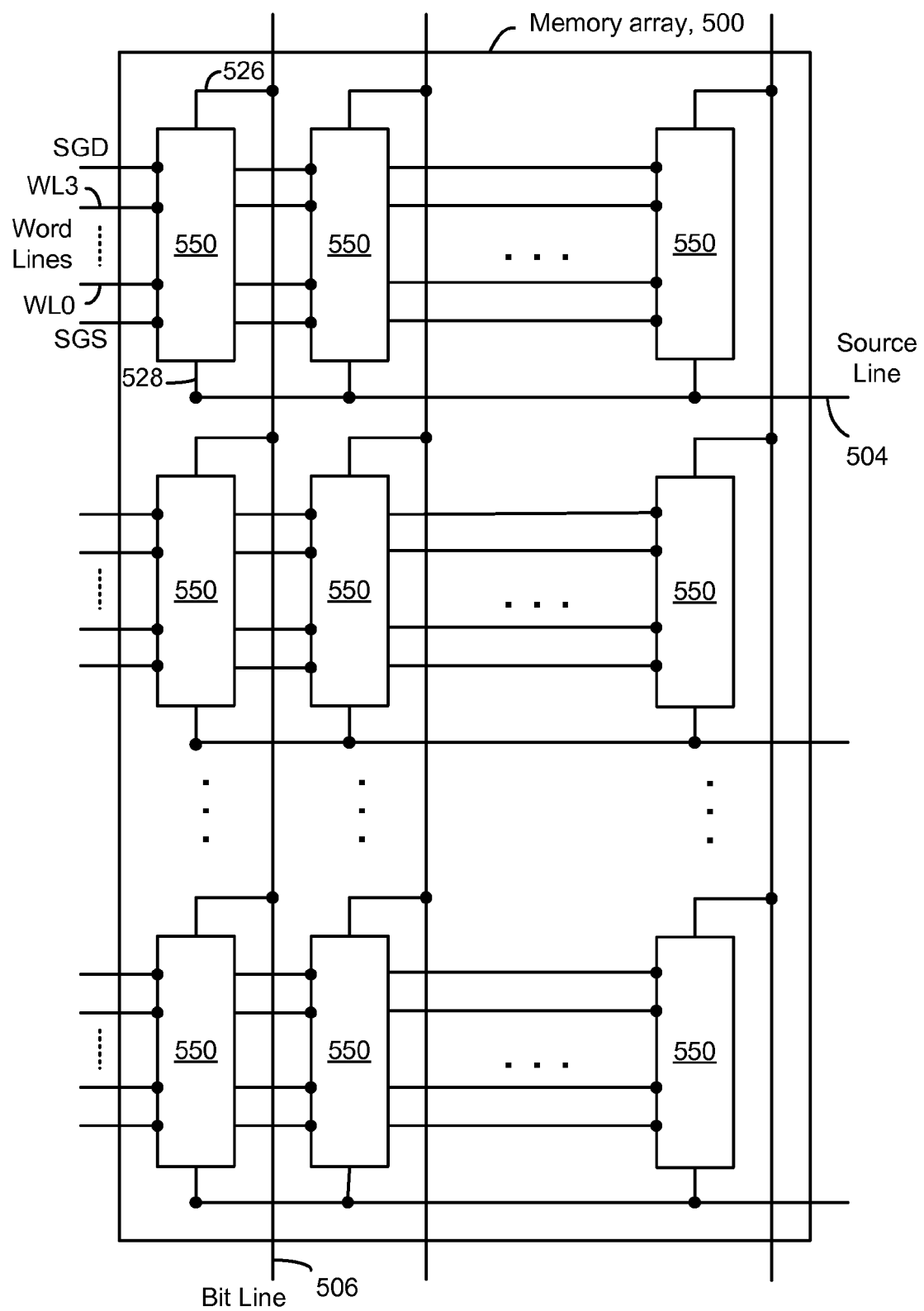
FIG. 5 is a block diagram of a portion of an array of NAND flash memory storage elements.

FIG. 5 illustrates an example of an array 500 of NAND storage elements, such as those shown in FIGS. 1*a-c*. Along each column, a bit line 506 is coupled to the drain terminal 526 of the drain select gate for the NAND string 550. Along each row of NAND strings, a source line 504 may connect all the source terminals 528 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into sectors and the sectors may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages.

Figure 6:
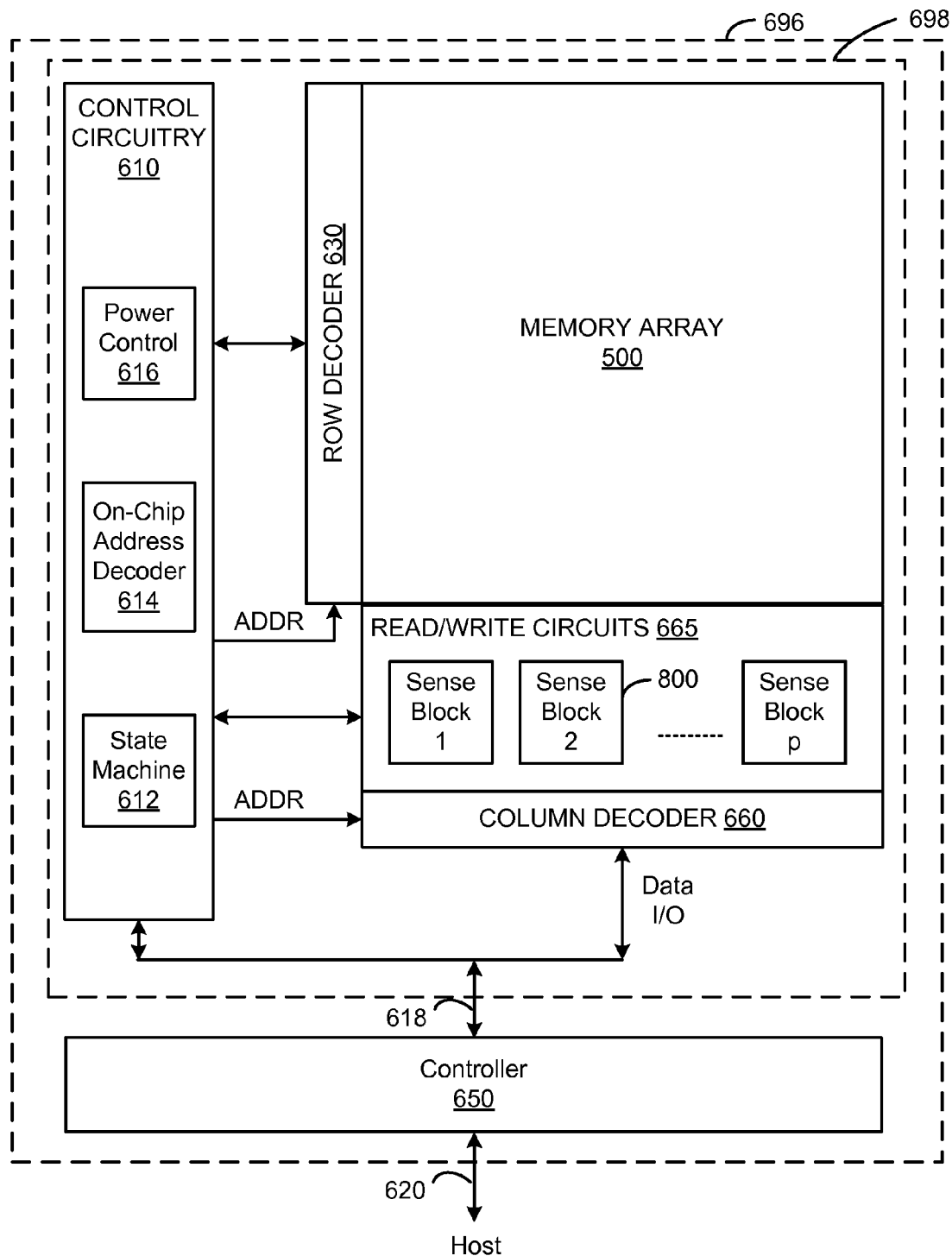
FIG. 6 is a block diagram of a non-volatile memory system.

FIG. 6 illustrates a memory device 696 having read/write circuits for reading and programming a page of storage elements in parallel, according to one embodiment of the present invention. Memory device 696 may include one or more memory die 698. Memory die 698 includes a two-dimensional array of storage elements 500, control circuitry 610, and read/write circuits 665. In some embodiments, the array of storage elements can be three dimensional. The memory array 500 is addressable by word lines via a row decoder 630 and by bit lines via a column decoder 660. Addressing is indicated by the notation "ADDR". The read/write circuits 665 include multiple sense blocks 800 (see also FIG. 8) and allow a page of storage elements to be read or programmed in parallel. Typically, a controller 650 is included in the same memory device 696 (e.g., a removable storage card) as the one or more memory die 698. Commands and Data are transferred between the host and controller 650 via lines 620 and between the controller and the one or more memory die 698 via lines 618.

The control circuitry 610 cooperates with the read/write circuits 665 to perform memory operations on the memory array 500. The control circuitry 510 includes a state machine 512, an on-chip address decoder 614 and a power control module 616. The state machine 612 provides chip-level control of memory operations. The on-chip address decoder 614 provides an address interface between that used by the host or a memory controller to the hardware address used by the decoders 630 and 660. The power control module 616 controls the power and voltages supplied to the word lines and bit lines during memory operations.

In some implementations, some of the components of FIG. 6 can be combined. In various designs, one or more of the components of FIG. 6 (alone or in combination), other than storage element array 500, can be thought of as a managing circuit. For example, a managing circuit may include any one of or a combination of control circuitry 610, state machine 612, decoders 614/660, power control 616, sense blocks 800, read/write circuits 665, controller 650, etc.

Figure 7:
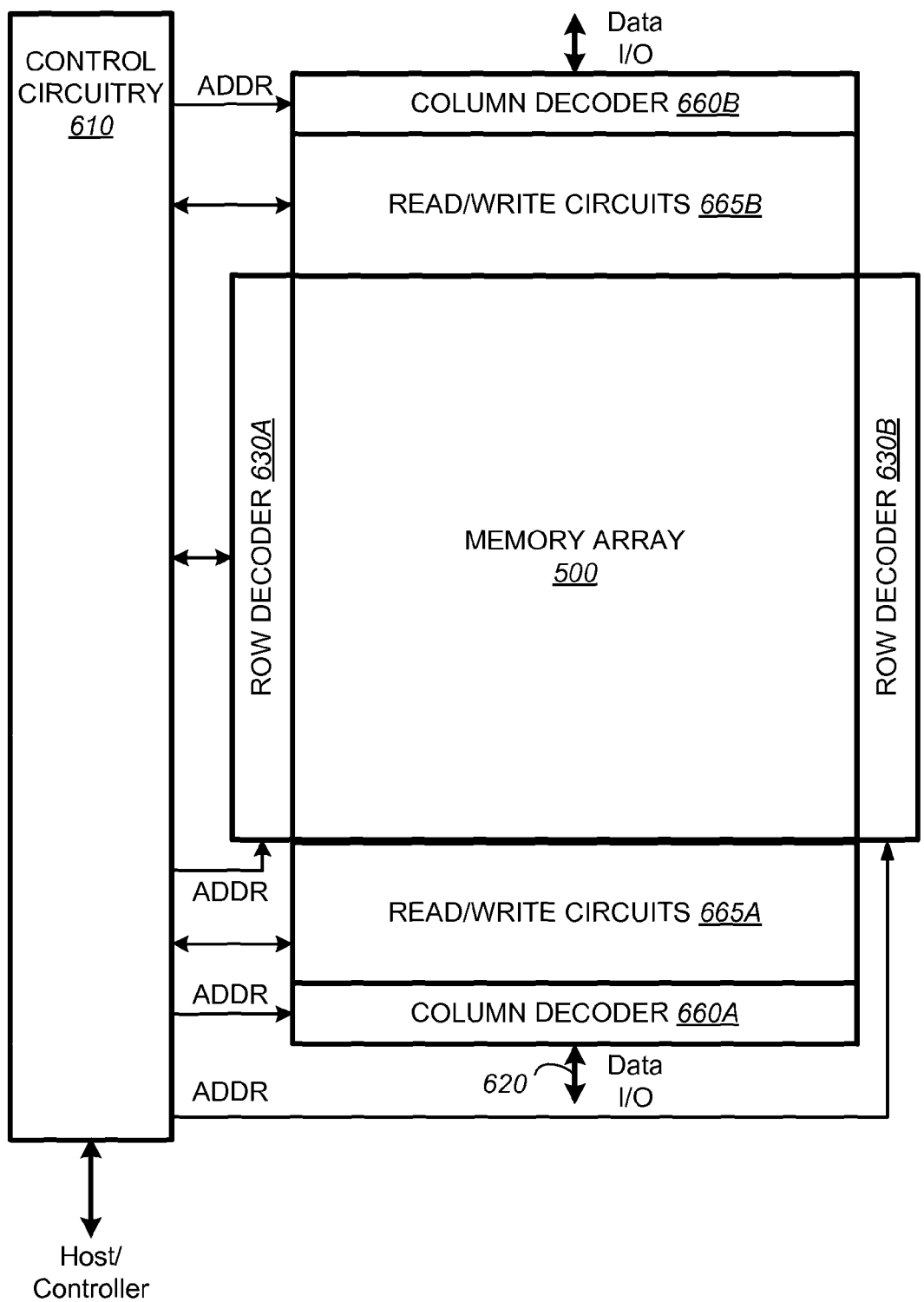
FIG. 7 is a block diagram of a non-volatile memory system.

FIG. 7 illustrates another arrangement of the memory device 696 shown in FIG. 6. Access to the memory array 500 by the various peripheral circuits is implemented in a symmetric fashion, on opposite sides of the array, so that the densities of access lines and circuitry on each side are reduced by half. Thus, the row decoder is split into row decoders 630A and 630B and the column decoder into column decoders 660A and 660B. Similarly, the read/write circuits are split into read/write circuits 665A connecting to bit lines from the bottom and read/write circuits 665B connecting to bit lines from the top of the array 500. In this way, the density of the read/write modules is essentially reduced by one half. The device of FIG. 7 can also include a controller, as described above for the device of FIG. 6.

Figure 8:
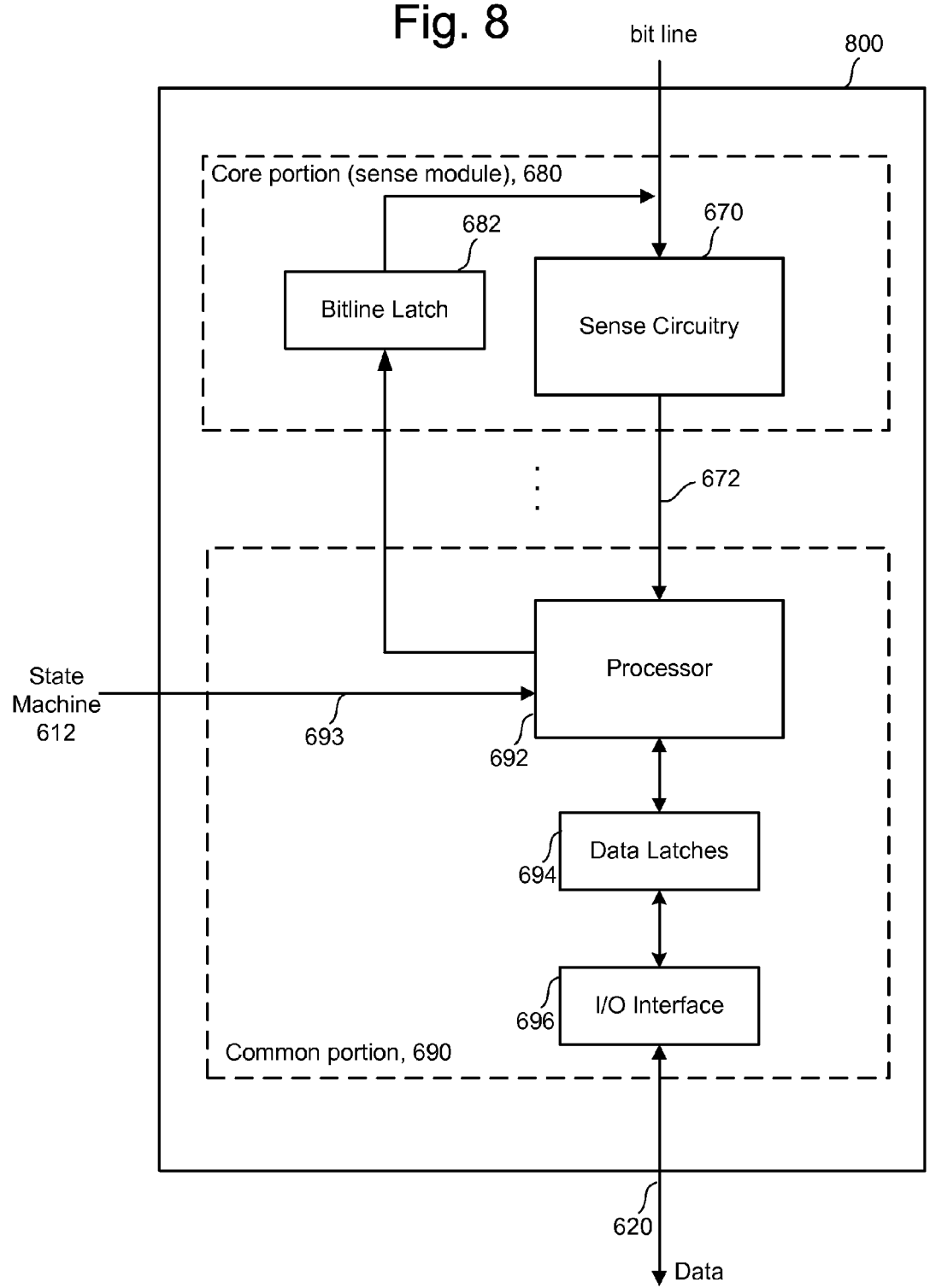
FIG. 8 is a block diagram depicting one embodiment of the sense block.

FIG. 8 is a block diagram of an individual sense block 800 partitioned into a core portion, referred to as a sense module or core portion 680, and a common portion 690. In one embodiment, there will be a separate sense module 680 for each bit line and one common portion 690 for a set of multiple sense modules 680. In one example, a sense block will include one common portion 690 and eight sense modules 680. Each of the sense modules in a group will communicate with the associated common portion via a data bus 672. For further details, refer to U.S. Patent App. Pub. 2006/0140007, titled "Non-Volatile Memory & Method with Shared Processing for an Aggregate of Sense Amplifiers," which is incorporated herein by reference in its entirety.

Sense module 680 comprises sense circuitry 670 that determines whether a conduction current in a connected bit line is above or below a predetermined threshold level. Sense module 680 also includes a bit line latch 682 that is used to set a voltage condition on the connected bit line. For example, a predetermined state latched in bit line latch 682 will result in the connected bit line being pulled to a state designating program inhibit (e.g., Vdd).

Common portion 690 comprises a processor 692, a set of data latches 694 and an I/O Interface 696 coupled between the set of data latches 694 and data bus 620. Processor 692 performs computations. For example, one of its functions is to determine the data stored in the sensed storage element and store the determined data in the set of data latches. The set of data latches 694 is used to store data bits determined by processor 692 during a read operation. It is also used to store data bits imported from the data bus 620 during a program operation. The imported data bits represent write data meant to be programmed into the memory. I/O interface 696 provides an interface between data latches 694 and the data bus 620.

During read or sensing, the operation of the system is under the control of state machine 612 that controls the supply of different control gate voltages to the addressed storage elements. As it steps through the various predefined control gate voltages corresponding to the various memory states supported by the memory, the sense module 680 may trip at one of these voltages and an output will be provided from sense module 680 to processor 692 via bus 672. At that point, processor 692 determines the resultant memory state by consideration of the tripping event(s) of the sense module and the information about the applied control gate voltage from the state machine via input lines 693. It then computes a binary encoding for the memory state and stores the resultant data bits into data latches 694. In another embodiment of the core portion, bit line latch 682 serves double duty, both as a latch for latching the output of the sense module 680 and also as a bit line latch as described above.

It is anticipated that some implementations will include multiple processors 692. In one embodiment, each processor 692 will include an output line (not depicted in FIG. 8) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all storage elements being programmed have reached the desired level. For example, when each storage element has reached its desired level, a logic zero for that storage element will be sent to the wired-OR line (or a data one is inverted). When all output lines output a data 0 (or a data one inverted), then the state machine knows to terminate the programming process. Because each processor communicates with eight sense modules, the state machine needs to read the wired-OR line eight times, or logic is added to processor 692 to accumulate the results of the associated bit lines such that the state machine need only read the wired-OR line one time.

During program or verify, the data to be programmed is stored in the set of data latches 694 from the data bus 620. The program operation, under the control of the state machine, comprises a series of programming voltage pulses applied to the control gates of the addressed storage elements. Each programming pulse is followed by a verify operation to determine if the storage element has been programmed to the desired state. Processor 692 monitors the verified memory state relative to the desired memory state. When the two are in agreement, the processor 692 sets the bit line latch 682 so as to cause the bit line to be pulled to a state designating program inhibit. This inhibits the storage element coupled to the bit line from further programming even if programming pulses appear on its control gate. In other embodiments the processor initially loads the bit line latch 682 and the sense circuitry sets it to an inhibit value during the verify process.

Data latch stack 694 contains a stack of data latches corresponding to the sense module. In one embodiment, there are three data latches per sense module 680. In some implementations (but not required), the data latches are implemented as a shift register so that the parallel data stored therein is converted to serial data for data bus 620, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, titled "Non-Volatile Memory And Method With Reduced Source Line Bias Errors," issued Mar. 27, 2007; (2) U.S. Pat. No. 7,023,736, titled "Non-Volatile Memory And Method with Improved Sensing," issued Apr. 4, 2006; (3) U.S. Pat. No. 7,046,568, titled "Improved Memory Sensing Circuit And Method For Low Voltage Operation," issued May 16, 2006; (4) U.S. Pat. No. 7,196,928, titled "Compensating for Coupling During Read Operations of Non-Volatile Memory," issued Mar. 27, 2007; and (5) U.S. Patent App. Pub. 2006/0158947, titled "Reference Sense Amplifier For Non-Volatile Memory, published Jul. 20, 2006. All five of the immediately above-listed patent documents are incorporated herein by reference in their entirety.

Figure 9:
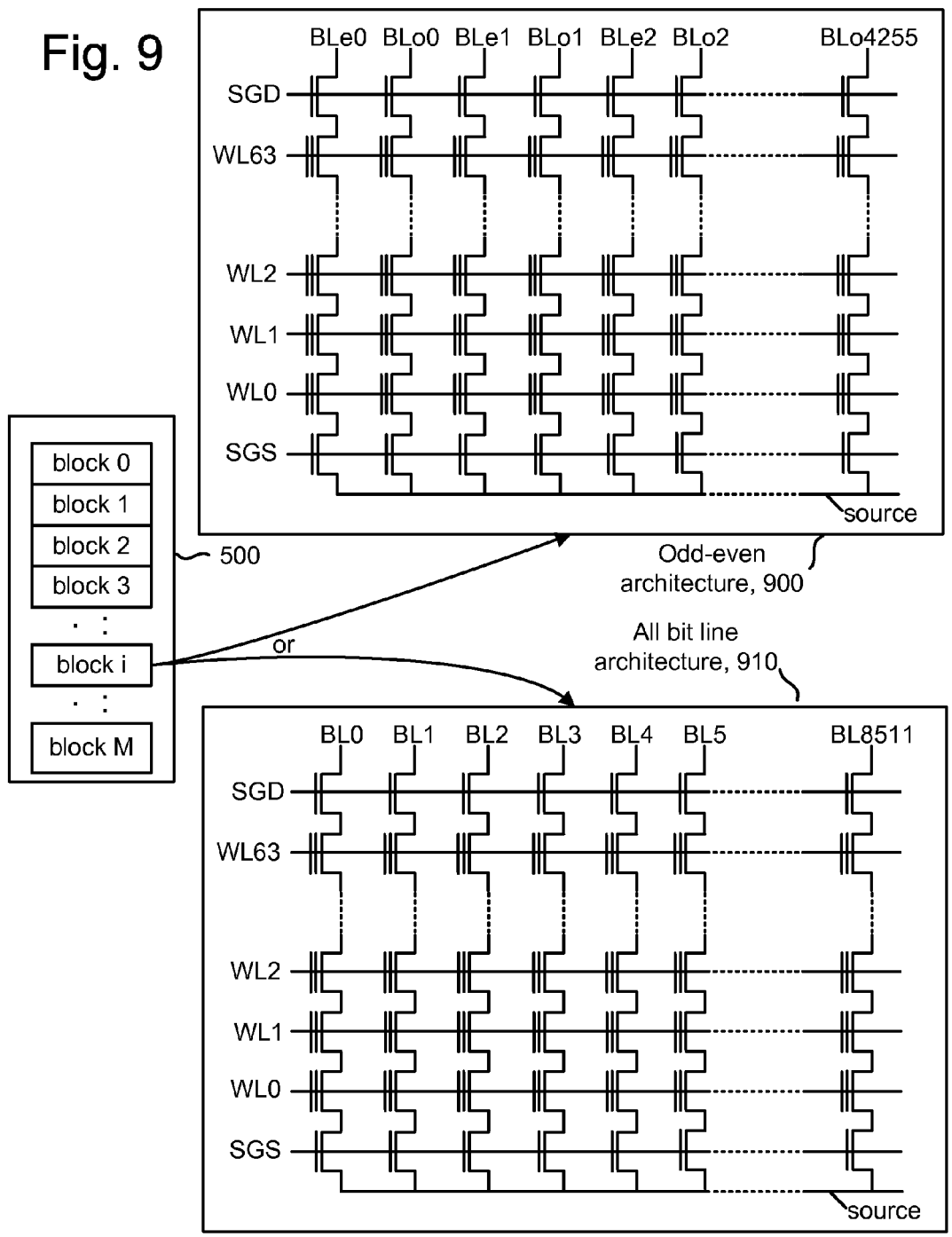
FIG. 9 is a block diagram of a memory array.

With reference to FIG. 9, an exemplary structure of storage element array 500 is described. As one example, a NAND flash EEPROM is described that is partitioned into 1,024 blocks (M=1,023). The data stored in each block can be simultaneously erased. In one embodiment, the block is the minimum unit of storage elements that are simultaneously erased. In one embodiment, depicted by an all bit line architecture 910 of an ith block, all the bit lines of a block can be simultaneously selected during read and program operations. Storage elements along a common word line and connected to any bit line can be programmed at the same time. In each block, in this example, there are 8,512 columns corresponding to bit lines BL0, BL1, . . . BL8511.

In another embodiment, depicted by an odd-even architecture 900 of an ith block, the bit lines are divided into even bit lines and odd bit lines. In an odd/even bit line architecture, storage elements along a common word line and connected to the odd bit lines are programmed at one time, while storage elements along a common word line and connected to even bit lines are programmed at another time. In each block, in this example, there are 8,512 columns corresponding to bit lines BLe0, BLo0, BLe1, BLo1, BLe2, BLo2 . . . BLo4255, where "e'" denotes even and "o" denotes odd.

In the examples shown, sixty-four storage elements are connected in series to form a NAND string. Although sixty-four storage elements are shown to be included in each NAND string, fewer or more can be used (e.g., 4, 16, 32, 128, or another number). One terminal of the NAND string is connected to a corresponding bit line via a drain select gate (connected to select gate drain line SGD), and another terminal is connected to common source via a source select gate (connected to select gate source line SGS).

Figure 10:
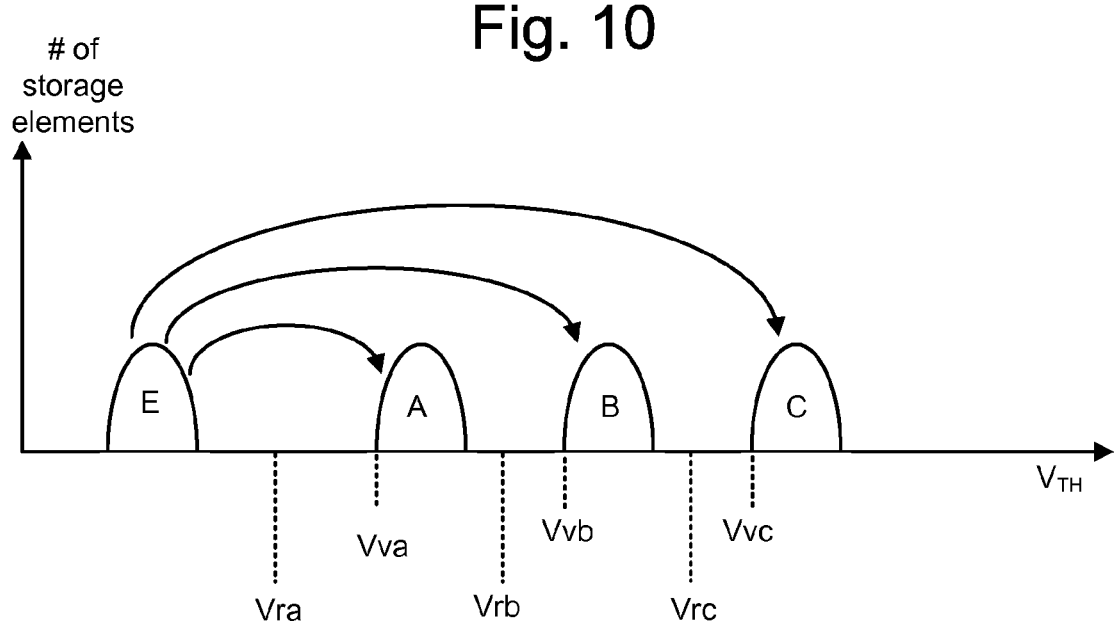
FIG. 10 depicts an example set of threshold voltage distributions.

FIG. 10 illustrates example threshold voltage distributions for the storage element array when each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Pat. No. 7,237,074, "Tracking Cells For A Memory System," issued Jun. 26, 2007, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are provided, the present invention can also be used with other multi-state structures including those that include more or less than four states.

Three read reference voltages, Vra, Vrb and Vrc, are provided for reading data from storage elements. By testing whether the threshold voltage of a given storage element is above or below Vra, Vrb and Vrc, the system can determine what state the storage element is in. Three verify reference voltages, Vva, Vvb and Vvc are also provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, which is a one-pass programming technique, storage elements can be programmed from the erase state E directly to any of the programmed states A, B or C. For example, a population of storage elements to be programmed may first be erased so that all storage elements in the population are in erased state E. While some storage elements are being programmed from state E to state A, other storage elements are being programmed from state E to state B and/or from state E to state C.

Figure 11:
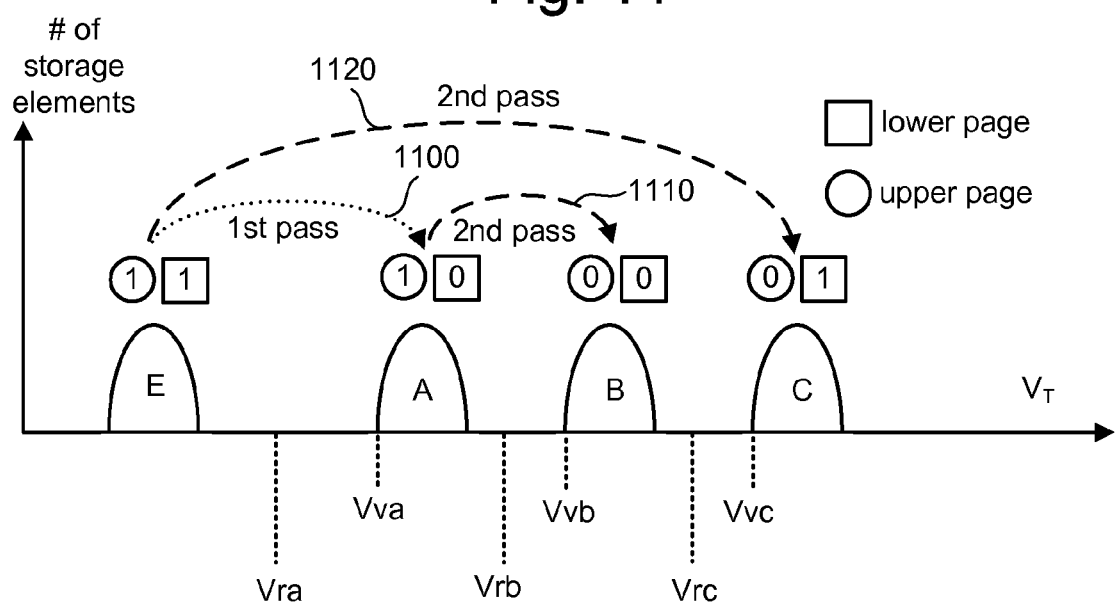
FIG. 11 depicts an example set of threshold voltage distributions.

FIG. 11 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1100.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1120. If the storage element had been programmed into state A as a result of the first programming pass, then the storage element is further programmed in the second pass so that the threshold voltage is increased to be within state B, as depicted by arrow 1110. The result of the second pass is to program the storage element into the state designated to store a logic "0" for the upper page without changing the data for the lower page.

In one embodiment, a system can be set up to perform full sequence writing if enough data is written to fill up a word line. If not enough data is written, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Pat. No. 7,120,051, issued Oct. 10, 2006, titled "Pipelined Programming of Non-Volatile Memories Using Early Data," incorporated herein by reference in its entirety.

Figure 12A:
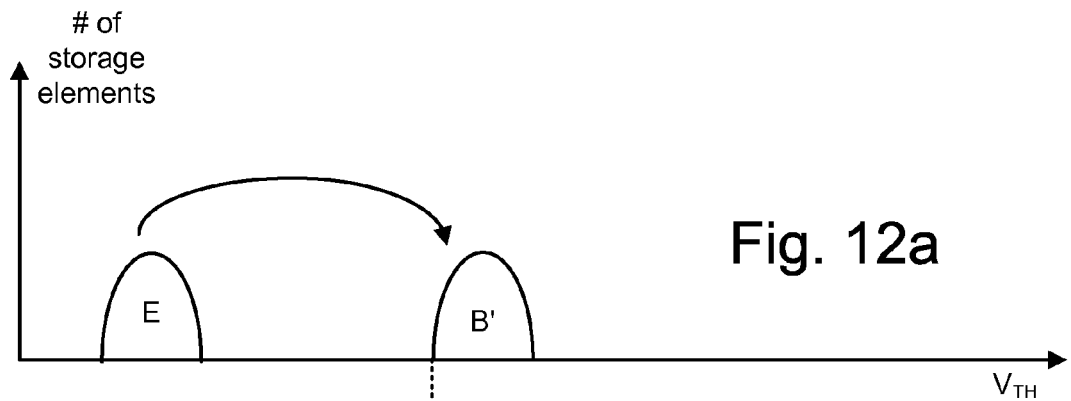
FIGS. 12a-c show various threshold voltage distributions and describe a process for programming non-volatile memory.
Figure 12B:
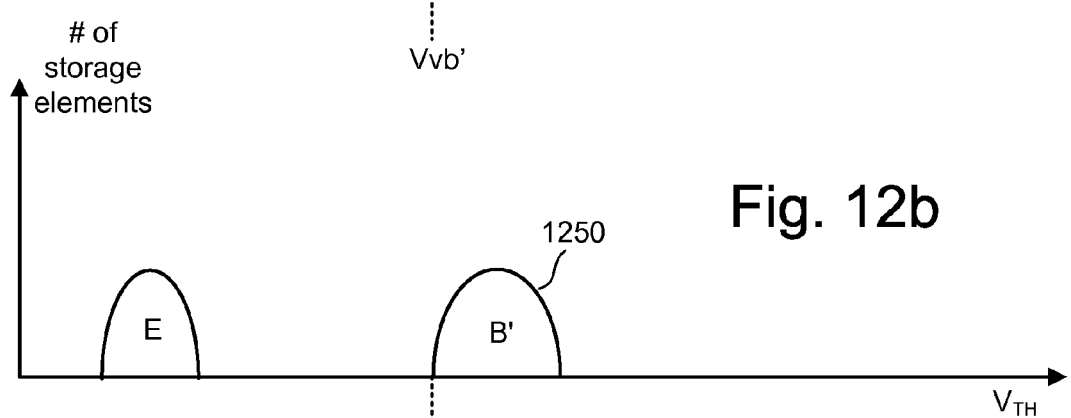
Figure 12C:
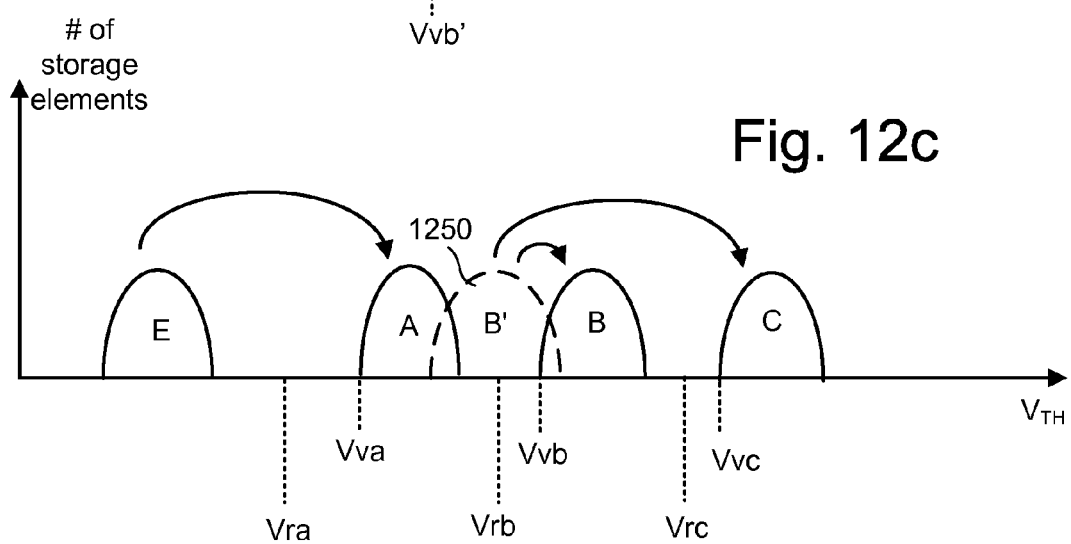

FIGS. 12a-c depict another process for programming non-volatile memory that reduces floating gate-to-floating gate coupling by, for any particular memory element, writing to that particular memory element with respect to a particular page subsequent to writing to adjacent memory elements for previous pages. In one example implementation, each of the non-volatile memory elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps. In the first step, the lower page is programmed. If the lower page is to remain data 1, then the memory element state remains at state E. If the data is to be programmed to 0, then the threshold voltage Vt of the memory element is raised such that the memory element is programmed to state B'. FIG. 12a therefore shows the programming of memory elements from state E to state B', which represents an interim state B; therefore, the verify point is depicted as Vvb', which is lower than Vvb, depicted in FIG. 12c.

In one design, after a memory element is programmed from state E to state B', its neighbor memory element on an adjacent word line is programmed with respect to its lower page. After programming the neighbor memory element, the floating gate-to-floating gate coupling effect will raise the apparent threshold voltage of memory element under consideration, which is in state B'. This will have the effect of widening the threshold voltage distribution for state B' to that depicted as threshold voltage distribution 1250 in FIG. 12b. This apparent widening of the threshold voltage distribution will be remedied when programming the upper page.

FIG. 12c depicts the process of programming the upper page. If the memory element is in erased state E and the upper page is to remain at 1, then the memory element will remain in state E. If the memory element is in state E and its upper page data is to be programmed to 0, the threshold voltage of the memory element will be raised so that the memory element is in state A. If the memory element is in state B' with the intermediate threshold voltage distribution 1250 and the upper page data is to remain at 1, the memory element will be programmed to final state B. If the memory element is in state B' with the intermediate threshold voltage distribution 1250 and the upper page data is to become data 0, the threshold voltage of the memory element will be raised so that the memory element is in state C. The process depicted by FIGS. 12a-c reduces the effect of floating gate-to-floating gate coupling because only the upper page programming of neighbor memory elements will have an effect on the apparent threshold voltage of a given memory element. An example of an alternate state coding is to move from distribution 1250 to state C when the upper page data is a 1, and to move to state B when the upper page data is a 0. Although FIGS. 12a-c provide an example with respect to four data states and two pages of data, the concepts taught can be applied to other implementations with more or fewer than four states and more or fewer than two pages. More detail about various programming schemes and floating gate-to-floating gate coupling can be found in the above-mentioned U.S. Pat. No. 7,196,928.

Figure 12D:
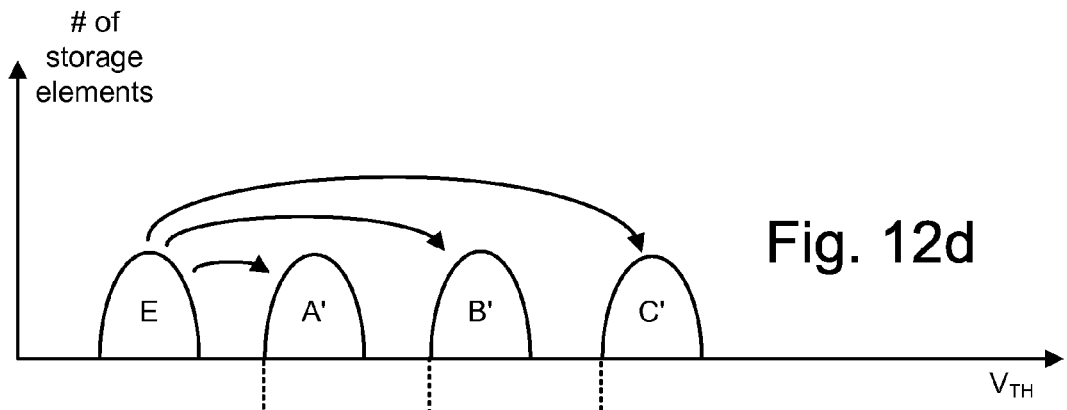
FIGS. 12d-f show various threshold voltage distributions and describe another process for programming non-volatile memory.
Figure 12E:
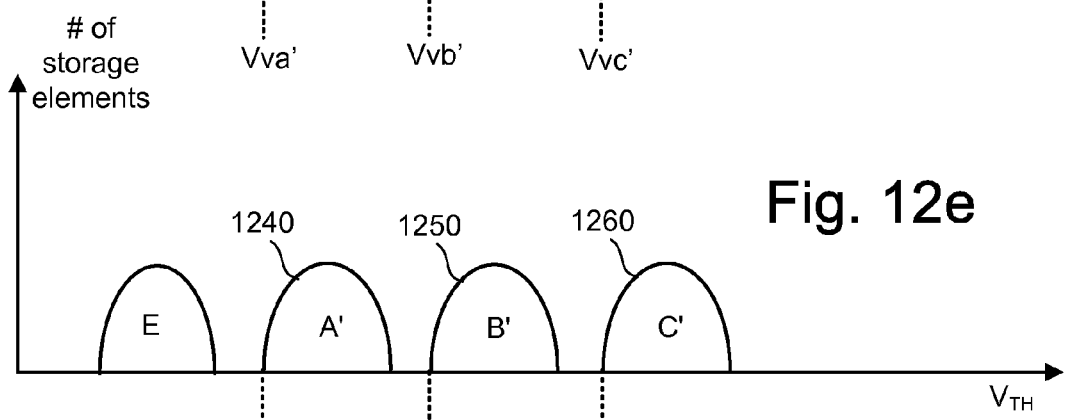
Figure 12F:
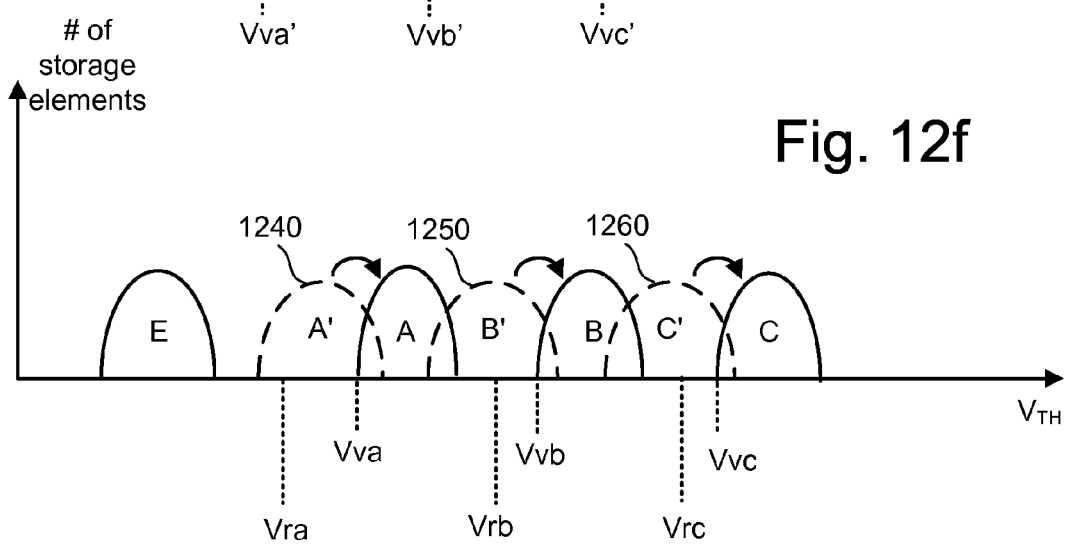

FIGS. 12d-f show various threshold voltage distributions and describe another process for programming non-volatile memory. This approach is similar to that of FIGS. 12a-c except that interim states A' and C' are used in addition to B'. Thus, if the lower page is to remain data 1 and the upper page is to remain data 1, then the memory element state remains at state E. If the data is to be programmed to 1 for the lower page and 0 for the upper page, then the Vt of the memory element is raised such that the memory element is programmed to state A'. If the data is to be programmed to 0 for the lower page and 1 for the upper page, then the Vt of the memory element is raised such that the memory element is programmed to state B'. If the data is to be programmed to 0 for the lower page and 0 for the upper page, then the Vt of the memory element is raised such that the memory element is programmed to state C'.

FIG. 12d therefore shows the programming of memory elements from state E to state A', B' or C', which represent interim states A, B and C, respectively; therefore, the verify points are depicted as Vva', Vvb' and Vvc', which are lower than Vva, Vvb and Vvc, respectively, depicted in FIG. 12f.

In one design, after a memory element is programmed from state E to state A', B' or C', its neighbor memory element on an adjacent word line is programmed. After programming the neighbor memory element, the floating gate-to-floating gate coupling effect will raise the apparent threshold voltage of memory element under consideration, which is in state A', B' or C'. This will have the effect of widening the threshold voltage distribution for state A', B' or C' to that depicted as threshold voltage distribution 1240, 1250 or 1260 in FIG. 12e. This apparent widening of the threshold voltage distribution will be remedied during a next programming pass, as depicted in FIG. 12f. The memory elements in state A', B' or C' with the intermediate threshold voltage distributions 1240, 1250 and 1260, respectively, are programmed to the final state A, B or C, respectively. The process depicted reduces the effect of floating gate-to-floating gate coupling further compared to the programming of FIGS. 12a-c because the shift in Vt of the neighbor memory elements is much smaller during the second programming pass. Although FIGS. 12d-f provide an example with respect to four data states and two pages of data, the concepts taught can be applied to other implementations with more or fewer than four states and more or fewer than two pages.

Figure 13:
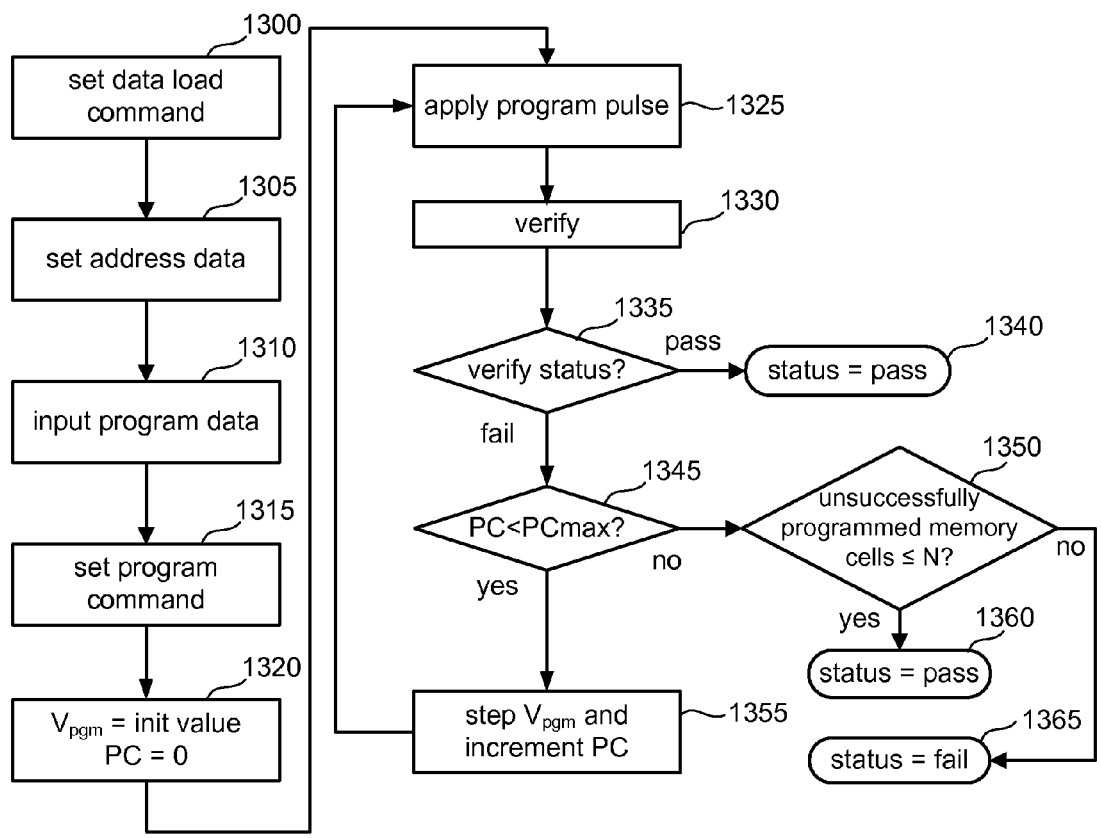
FIG. 13 is a flow chart describing one embodiment of a process for programming non-volatile memory.

FIG. 13 is a flow chart describing one embodiment of a method for programming non-volatile memory. In one implementation, storage elements are erased (in blocks or other units) prior to programming. Storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

In step 1300, a "data load" command is issued by the controller and received by control circuitry 610 (referring also to FIG. 6). In step 1305, address data designating the page address is input to decoder 614 from the controller or host. In step 1310, a page of program data for the addressed page is input to a data buffer for programming. That data is latched in the appropriate set of latches. In step 1315, a "program" command is issued by the controller to state machine 612.

Triggered by the "program" command, the data latched in step 1310 will be programmed into the selected storage elements controlled by state machine 612 using a series of programming waveforms, as discussed previously, applied to the appropriate word line. In step 1320, the program voltage $V_{PGM}$ is initialized to the starting pulse (e.g., 12 V or other value) and a program counter PC maintained by state machine 612 is initialized at zero. In particular, each of the multilevel portions of the programming waveform can be initialized to a respective starting level. The magnitude of the initial program pulse can be set, e.g., by properly programming a charge pump. At step 1325, the first program pulse is applied to the selected word line.

If logic "0" is stored in a particular data latch indicating that the corresponding storage element should be programmed, then the corresponding bit line is grounded for a portion of each waveform based on the state to which the storage element is to be programmed. On the other hand, if logic "1" is stored in the particular latch indicating that the corresponding storage element should remain in its current data state, then the corresponding bit line is connected to Vdd to inhibit programming.

At step 1330, the states of the selected storage element are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected storage elements have been programmed. At step 1335, it is checked whether all of the data latches are storing logic "1." If so, the programming process is complete and successful because all selected memory storage elements were programmed and verified to their target states. A status of "PASS" is reported at step 1340. Optionally, a pass can be declared at step 1335 even when some of the memory elements have not yet reached their desired state. Thus, even if a certain number of storage elements can not reach the desired state, programming can stop before the maximum number of loops is reached.

If, at step 1335, it is determined that not all of the data latches are storing logic "1," then the programming process continues. At step 1345, the program counter PC is checked against a program limit value, PCmax. One example of a program limit value is twenty; however, other values can be used in various implementations. If the program counter PC is not less than PCmax, then it is determined at step 1350 whether the number of storage elements that have not been successfully programmed is equal to or less than a predetermined number, N. If the number of unsuccessfully programmed storage elements is equal to or less than N, the programming process is flagged as passed and a status of pass is reported at step 1360. The storage elements that are not successfully programmed can be corrected using error correction during the read process. If however, the number of unsuccessfully programmed storage elements is greater than the predetermined number, the program process is flagged as failed, and a status of fail is reported at step 1365. If the program counter PC is less than PCmax, then the $V_{PGM}$ level is increased by the step size and the program counter PC is incremented at step 1355. In particular, each portion of the $V_{PGM}$ waveform can be increased by the step size. After step 1355, the process loops back to step 1325 to apply the next program pulse.

The flowchart depicts a single-pass programming method as can be applied for multi-level storage, such as depicted in FIG. 10. In a two-pass programming method, such as depicted in FIGS. 11 and 12*a-f*, multiple programming or verification steps may be used in a single iteration of the flowchart. Steps 1320-1365 may be performed for each pass of the programming operation. In a first pass, one or more program waveforms may be applied and the results thereof verified to determine if a storage element is in the appropriate intermediate state. In a second pass, one or more program waveforms may be applied and the results thereof verified to determine if the storage element is in the appropriate final state. At the end of a successful program process, the threshold voltages of the memory storage elements should be within one or more distributions of threshold voltages for programmed memory storage elements or within a distribution of threshold voltages for erased memory storage elements.

Figure 14:
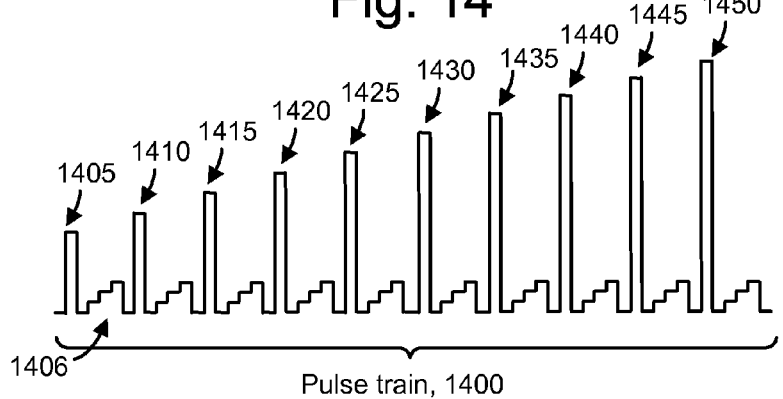
FIG. 14 depicts an example pulse train applied to the control gates of non-volatile storage elements during programming.

FIG. 14 depicts an example pulse train applied to the control gates of non-volatile storage elements during programming. The pulse train 1400 includes a series of program pulses 1405, 1410, 1415, 1420, 1425, 1430, 1435, 1440, 1445, 1450, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 1406 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 10) or Vvb' (FIG. 12*a*), for instance.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
a plurality of non-volatile storage elements formed on a substrate and spaced apart from one another along the substrate in a first direction, each non-volatile storage element comprising an associated bottom insulating layer above the substrate, an associated floating gate above the bottom insulating layer, an associated control gate above the floating gate, and at least one associated sidewall insulating layer extending upwards at least partway along one side of the associated floating gate, where the floating gates comprise inverted T structures; and
epitaxially grown regions extending upwards from the substrate between respective pairs of non-volatile storage elements of the plurality of non-volatile storage elements, to a height which is above a bottom level of the floating gates, where, for each non-volatile storage element, the at least one associated sidewall insulating layer has a thickness near the associated floating gate which is less than about two-thirds of a thickness of the bottom insulating layer.

2. The non-volatile storage system of claim 1, wherein:
the thickness of the at least one associated sidewall insulating layer is less than about 0.6 of the thickness of the bottom insulating layer.

3. The non-volatile storage system of claim 1, wherein:
the thickness of the at least one associated sidewall insulating layer is less than about 0.4 of the thickness of the bottom insulating layer.

4. The non-volatile storage system of claim 1, wherein:
the thickness of the at least one associated sidewall insulating layer is no more than about 6 nm, and the thickness of the bottom insulating layer is at least about 10 nm.

5. The non-volatile storage system of claim 1, wherein:
the thickness of the at least one associated sidewall insulating layer is no more than about 8 nm, and the thickness of the bottom insulating layer is at least about 12 nm.

6. The non-volatile storage system of claim 1, wherein:
the floating gates are spaced apart from one another along the substrate in the first direction by a pitch of no more than 30 nm.

7. The non-volatile storage system of claim 1, wherein:
the epitaxially grown regions overlap the floating gates by no more than about 25% of a height of the floating gates.

8. The non-volatile storage system of claim 1, wherein:
the epitaxially grown regions overlap the floating gates by no more than about 15% of a height of the floating gates.

9. The non-volatile storage system of claim 1, wherein:
each floating gate stores a charge which represents an associated data level, at least four data levels are represented by the charges stored in the floating gates.

10. The non-volatile storage system of claim 1, wherein:
the epitaxially grown regions each comprise a doped portion above an undoped portion, the undoped portion extends to a height which is above the bottom level of the floating gates.

11. A non-volatile storage system, comprising:
a plurality of non-volatile storage elements formed on a substrate and spaced apart from one another along the substrate in a first direction, each non-volatile storage element comprising an associated bottom insulating layer above the substrate, an associated floating gate above the bottom insulating layer, an associated control gate above the floating gate, and at least one associated sidewall insulating layer extending upwards at least partway along one side of the associated floating gate; and
epitaxially grown regions extending upwards from the substrate between respective pairs of non-volatile storage elements of the plurality of non-volatile storage elements, to a height which is above a bottom level of the floating gates, where, for each non-volatile storage element, the at least one associated sidewall insulating layer has a thickness near the associated floating gate which is less than about two-thirds of a thickness of the bottom insulating layer, the epitaxially grown regions each comprise a doped portion above an undoped portion, and the undoped portion extends to a height which is above the bottom level of the floating gates.

12. The non-volatile storage system of claim 11, wherein:
the thickness of the at least one associated sidewall insulating layer is less than about 0.6 of the thickness of the bottom insulating layer.

13. The non-volatile storage system of claim 11, wherein:
the thickness of the at least one associated sidewall insulating layer is less than about 0.4 of the thickness of the bottom insulating layer.

14. The non-volatile storage system of claim 11, wherein:
the thickness of the at least one associated sidewall insulating layer is no more than about 6 nm, and the thickness of the bottom insulating layer is at least about 10 nm.

15. The non-volatile storage system of claim 11, wherein:
the thickness of the at least one associated sidewall insulating layer is no more than about 8 nm, and the thickness of the bottom insulating layer is at least about 12 nm.

16. The non-volatile storage system of claim 11, wherein:
each non-volatile storage element comprises a stacked configuration in which the associated bottom insulating layer, associated floating gate, and associated control gate have a substantially common width in the first direction.

17. The non-volatile storage system of claim 11, wherein:
the epitaxially grown regions overlap the floating gates by no more than about 25% of a height of the floating gates.

18. The non-volatile storage system of claim 11, wherein:
the epitaxially grown regions overlap the floating gates by no more than about 15% of a height of the floating gates.

* * * * *